US008420482B2

(12) United States Patent
Lim et al.

(10) Patent No.: US 8,420,482 B2
(45) Date of Patent: Apr. 16, 2013

(54) NONVOLATILE MEMORY DEVICE AND METHOD OF FORMING THE SAME

(75) Inventors: Juwan Lim, Seoul (KR); Sungkweon Baek, Suwon-si (KR); Kwangmin Park, Seoul (KR); Seungjae Baik, Hwaseong-si (KR); Kihyun Hwang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 596 days.

(21) Appl. No.: 12/458,732

(22) Filed: Jul. 21, 2009

(65) Prior Publication Data
US 2010/0062595 A1 Mar. 11, 2010

(30) Foreign Application Priority Data
Sep. 5, 2008 (KR) .................. 10-2008-0087868

(51) Int. Cl.
*H01L 21/8247* (2006.01)
(52) U.S. Cl.
USPC .................................. 438/261; 257/E21.179
(58) Field of Classification Search .......... 438/257–267; 257/E21.179
See application file for complete search history.

(56) References Cited

U.S. PATENT DOCUMENTS

| 5,258,333 | A | * | 11/1993 | Shappir et al. ............... 438/762 |
| 5,407,870 | A | * | 4/1995 | Okada et al. ................. 438/591 |
| 2006/0178019 | A1 | | 8/2006 | Senzaki et al. |
| 2007/0238316 | A1 | * | 10/2007 | Ohashi ......................... 438/775 |

FOREIGN PATENT DOCUMENTS

| JP | 2005-536055 A | 11/2005 |
| JP | 2007-281181 A | 10/2007 |
| KR | 10-2003-0081898 A | 10/2003 |
| KR | 10-2005-0069986 A | 7/2005 |

* cited by examiner

*Primary Examiner* — Richard A. Booth
(74) *Attorney, Agent, or Firm* — Lee & Morse, P.C.

(57) ABSTRACT

A nonvolatile memory device and a method of forming the nonvolatile memory device, the method including forming a tunnel insulating layer on a substrate, wherein forming the tunnel insulating layer includes forming a multi-element insulating layer by a process including sequentially supplying a first element source, a second element source, and a third element source to the substrate, forming a charge storage layer on the tunnel insulating layer, forming a blocking insulating layer on the charge storage layer, and forming a control gate electrode on the blocking insulating layer.

21 Claims, 15 Drawing Sheets

NONVOLATILE MEMORY DEVICE AND METHOD OF FORMING THE SAME

BACKGROUND

1. Field

Embodiments relate to a nonvolatile semiconductor device and a method of forming the same.

2. Description of the Related Art

Semiconductor devices may be classified into volatile memory devices and nonvolatile memory devices. Volatile memory devices may lose stored data when a power supply is interrupted. Nonvolatile memory devices may maintain stored data even when a power supply is interrupted. Volatile memory devices may include, e.g., a dynamic random access memory (DRAM) device and a static random access memory (SRAM) device. Nonvolatile memory devices may include, e.g., a flash memory device, a phase change memory device, and/or a ferromagnetic memory device. As the semiconductor industry becomes highly developed, nonvolatile memory devices having a high integration and a superior characteristic may be required. Many studies have been performed to satisfy requirements of users.

SUMMARY

Embodiments are therefore directed to a nonvolatile semiconductor device and a method of forming the same, which substantially overcome one or more of the drawbacks, limitations, and/or disadvantages of the related art.

It is therefore a feature of an embodiment to provide a method of forming a non-volatile memory device that allows for easy control of formation of a multi-element insulating layer.

It is therefore another feature of an embodiment to provide a method of forming a non-volatile memory device that allows for excellent thickness uniformity in the multi-element insulating layer.

It is therefore another feature of an embodiment to provide a non-volatile memory device optimized for a high level of integration.

It is therefore another feature of an embodiment to provide a non-volatile memory device having superior data retention by minimizing the amount of bulk traps in the multi-element insulating layer.

At least one of the above and other features and advantages may be realized by providing a method of forming a nonvolatile memory device including forming a tunnel insulating layer on a substrate, wherein forming the tunnel insulating layer includes forming a multi-element insulating layer by a process including sequentially supplying a first element source, a second element source, and a third element source to the substrate, forming a charge storage layer on the tunnel insulating layer, forming a blocking insulating layer on the charge storage layer, and forming a control gate electrode on the blocking insulating layer.

One of the first, second, and third element sources may be a silicon source, another may be a nitrogen source, and the other may be an oxygen source.

The third element source may be the oxygen source and one of the first and second element sources may be the silicon source and the other may be the nitrogen source.

The multi-element insulating layer may include a silicon oxynitride layer, and an oxygen content of the multi-element insulating layer may be about 30 at. % to about 60 at. %.

Forming the multi-element insulating layer may include performing a plurality of cycles, each cycle including sequentially supplying the first element source, the second element source, and the third element source to the substrate.

Forming the multi-element insulating layer may include, in sequence adsorbing the first element source onto the substrate, purging a non-adsorbed first element source, supplying the second element source to the substrate to react with the adsorbed first element source, purging an unreacted second element source and a reaction residual, supplying the third element source to the substrate to react with the reacted first and second elements, and purging an unreacted third element source and a reaction residual.

An energy band gap of a bottom surface of the multi-element insulating layer may be different from an energy band gap of a top surface of the multi-element insulating layer.

One of the first, second, and third element sources may be a silicon source, another may be a nitrogen source, and the other may be an oxygen source, forming the multi-element insulating layer may include performing a plurality of cycles, each cycle including sequentially supplying the first element source, the second element source, and the third element source to the substrate, and an amount of the oxygen source supplied during the first cycle among the cycles may be different from an amount of the oxygen source supplied during a last cycle among the cycles.

The amount of the oxygen source supplied during a first cycle may be greater than the amount of the oxygen source supplied during a last cycle.

The plurality of cycles may include at least one middle cycle between the first cycle and the last cycle, and an amount of the oxygen source supplied during the middle cycle may be equal to or less than an amount of the oxygen source supplied during a cycle performed just before the middle cycle.

The amount of the oxygen source supplied during a first cycle may be less than the amount of the oxygen source supplied during a last cycle.

The plurality of cycles may include at least one middle cycle between the first cycle and the last cycle, and an amount of the oxygen source supplied during the middle cycle may be equal to or greater than an amount of the oxygen source supplied during a cycle performed just before the middle cycle.

An energy band gap of the multi-element insulating layer may be substantially uniform.

Forming the tunnel insulating layer may further include forming an interface layer on the substrate prior to forming the multi-element insulating layer, and the multi-element insulating layer may be formed on the interface layer.

The method may further include annealing the multi-element insulating layer prior to forming the charge storage layer.

A process gas used in the annealing may include at least one of oxygen, ozone, nitrogen, nitric oxide, nitrous oxide, chlorine, and fluorine.

Forming the multi-element insulating layer may include sequentially supplying the first element source to the substrate at a first temperature, the second element source to the substrate at a second temperature, and the third element source to the substrate at a third temperature.

The first temperature, the second temperature, and the third temperature may all be different from each other.

At least one of the above and other features and advantages may also be realized by providing a nonvolatile memory device including a tunnel insulating layer on a substrate, the tunnel insulating layer including a multi-element insulating layer formed by a process including sequentially supplying a first element source, a second element source, and a third element source to the substrate, a charge storage layer on the tunnel insulating layer, a blocking insulating layer on the charge storage layer, and a control gate electrode on the blocking insulating layer.

An energy band gap of a bottom surface of the multi-element insulating layer may be different from an energy band gap of a top surface of the multi-element insulating layer.

The multi-element insulating layer may be a silicon oxynitride layer, and an oxygen content of the bottom surface of the multi-element insulating layer may be different from an oxygen content of the top surface of the multi-element insulating layer.

The energy band gap of the multi-element insulating layer may gradually decrease from the bottom surface of the multi-element insulating layer to the top surface of the multi-element insulating layer.

The energy band gap of the multi-element insulating layer may gradually increase from the bottom surface of the multi-element insulating layer to the top surface of the multi-element insulating layer.

An energy band gap of the multi-element insulating layer may be substantially uniform.

One of the first, second, and third element sources may be a silicon source, another may be a nitrogen source, and the other may be an oxygen source.

The oxygen content of the multi-element insulating layer may be about 30 at. % to about 60 at. %.

The charge storage layer may include an insulating material including traps storing charges.

The charge storage layer may include a doped semiconductor material, and a dopant in the charge storage layer may be of the same type as a dopant in a channel region defined in the substrate under the control gate electrode.

The charge storage layer and the channel region may include p-type dopants.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
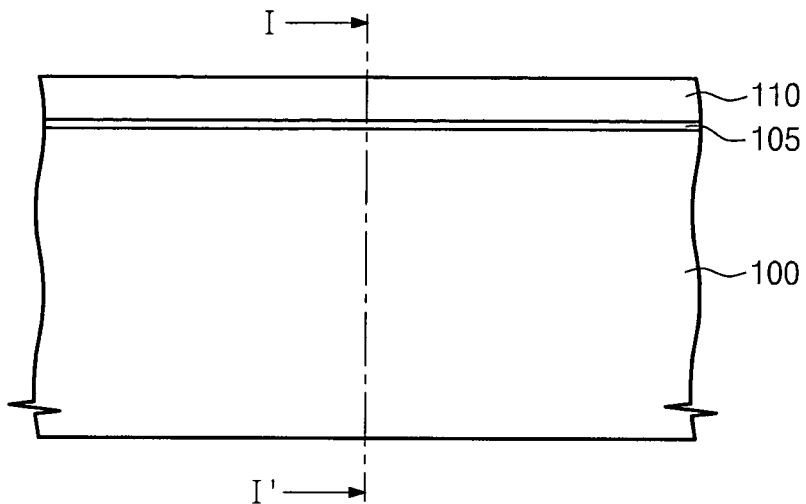
FIGS. 1A, 2A, and 3A illustrate cross sectional views of a method of forming a nonvolatile memory device in accordance with an embodiment.

Korean Patent Application No. 10-2008-0087868, filed on Sep. 5, 2008, in the Korean Intellectual Property Office, and entitled: "Nonvolatile Memory Device and Methods of Forming the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc., may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope illustrated in the embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 1B:
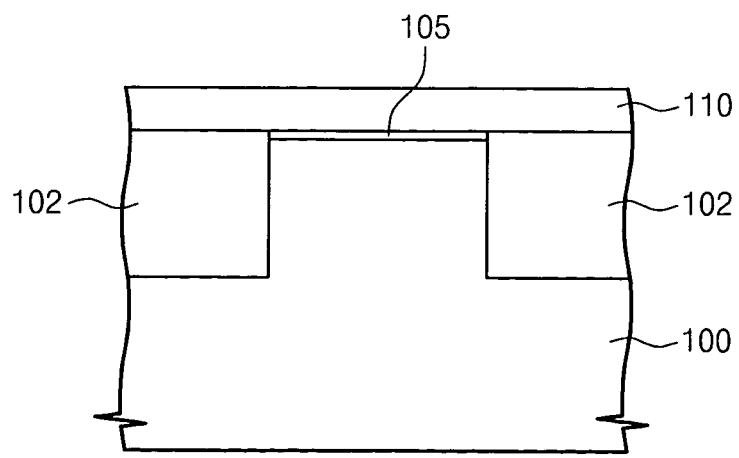
FIGS. 1B, 2B, and 3B illustrate cross sectional views taken along the lines I-I' of FIGS. 1A, 2A, and 3A, respectively.
Figure 2A:
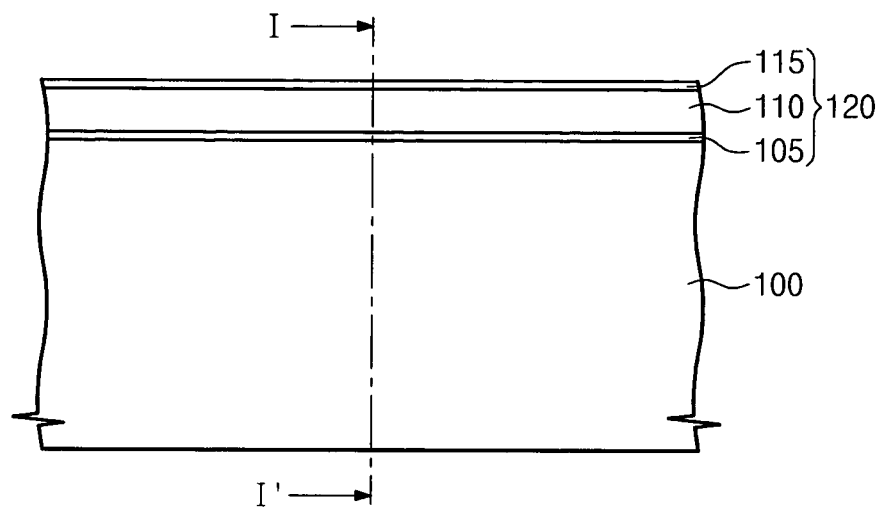
Figure 2B:
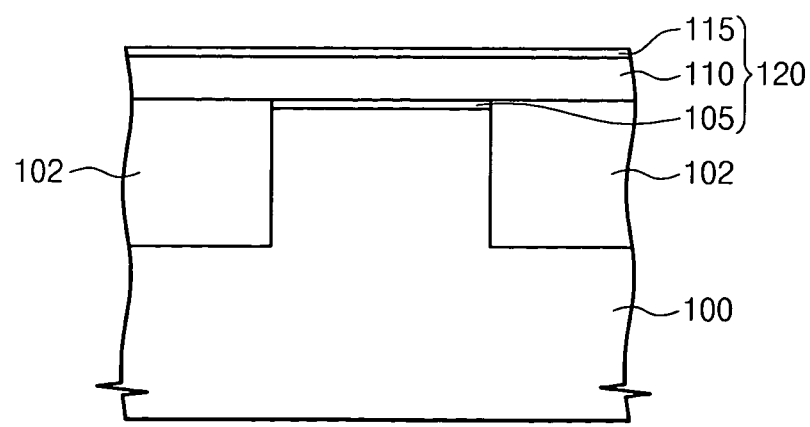
Figure 3A:
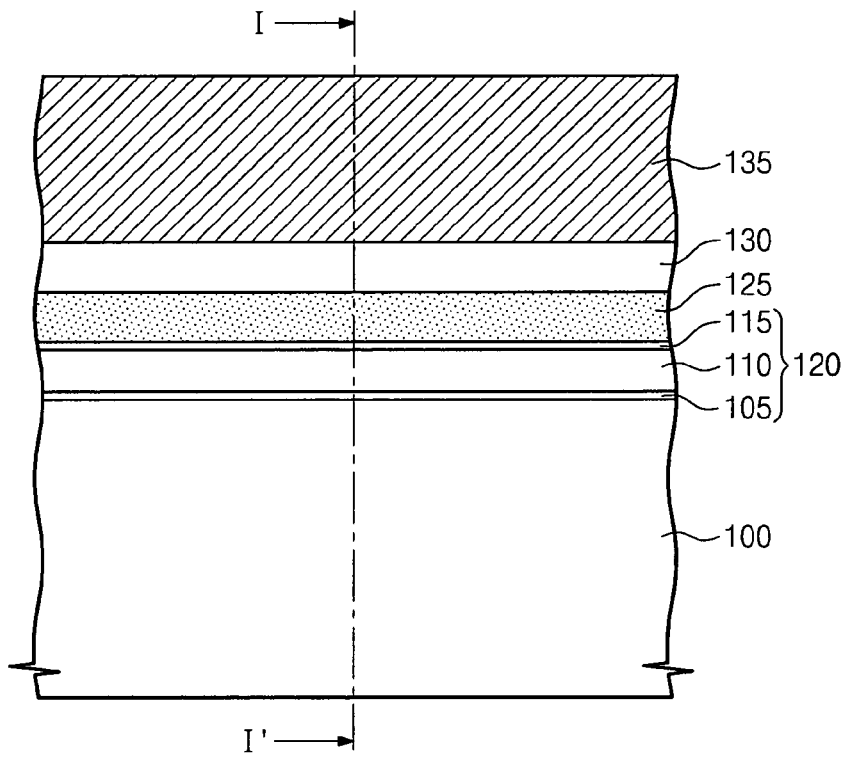
Figure 3B:
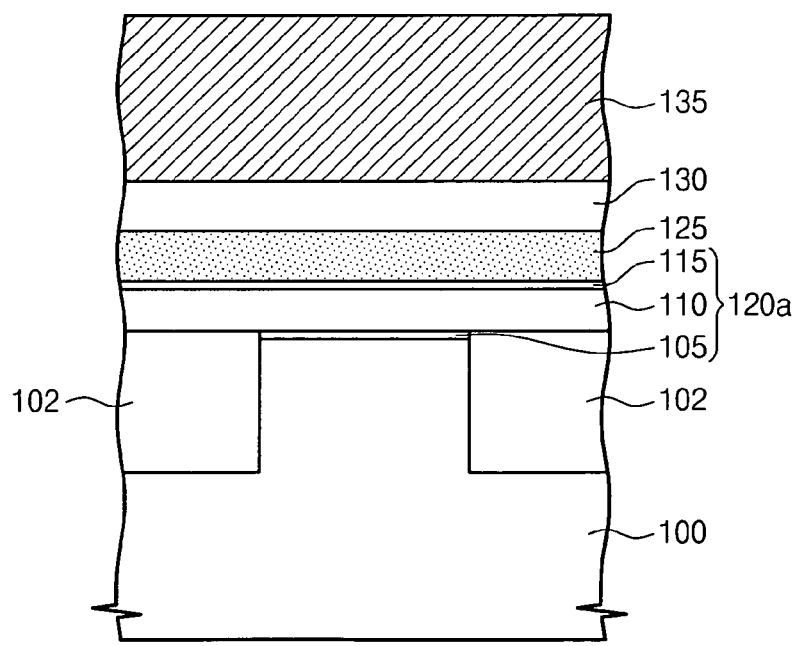

FIGS. 1A to 3B illustrate cross sectional views of a method of forming a nonvolatile memory device in accordance with an embodiment. FIGS. 1B, 2B, and 3B illustrate cross sectional views taken along the line I-I' of FIGS. 1A, 2A, and 3A respectively.

Referring to FIGS. 1A and 1B, a device isolation pattern 102 may be formed in a semiconductor substrate 100 (hereinafter referred to as a "substrate") to define an active region. The device isolation pattern 102 may be, e.g., a trench type. That is, a trench defining the active region may be formed, and the trench may be filled with an insulating material to form the device isolation pattern 102. The active region may be a portion of the substrate 100 surrounded by the device isolation pattern 102.

An interface layer 105 may be formed on a portion of the substrate 100 including the active region. For example, a thermal oxidation process may be performed on the portion of the substrate 100 including the active region to form the interface layer 105. The thermal oxidation process for the interface layer 105 may use a process gas including, e.g., oxygen ($O_2$), nitrous oxide ($N_2O$), nitric oxide (NO), and/or hydrogen/oxygen ($H_2/O_2$). The interface layer 105 may be formed on only a top surface of the active region by the thermal oxidation process. The interface layer 105 may have a thickness of about 5 Å to about 70 Å. A nitrogen treatment process may be performed on the interface layer 105. Nitrogen may be included in the interface layer 105 by the nitrogen treatment process to form a nitrogen treated interface layer 105. Nitrogen in the nitrogen treated interface layer 105 may accumulate at an interface between the nitrogen treated interface layer 105 and the active regions and/or at a region near the interface. Bulk traps in the interface layer 105 and/or traps at the interface between the interface layer 105 and the active region may be beneficially minimized by the nitrogen treatment process. The nitrogen treatment process may be performed using a process gas including, e.g., nitric oxide (NO) and/or ammonia ($NH_3$).

Figure 4:
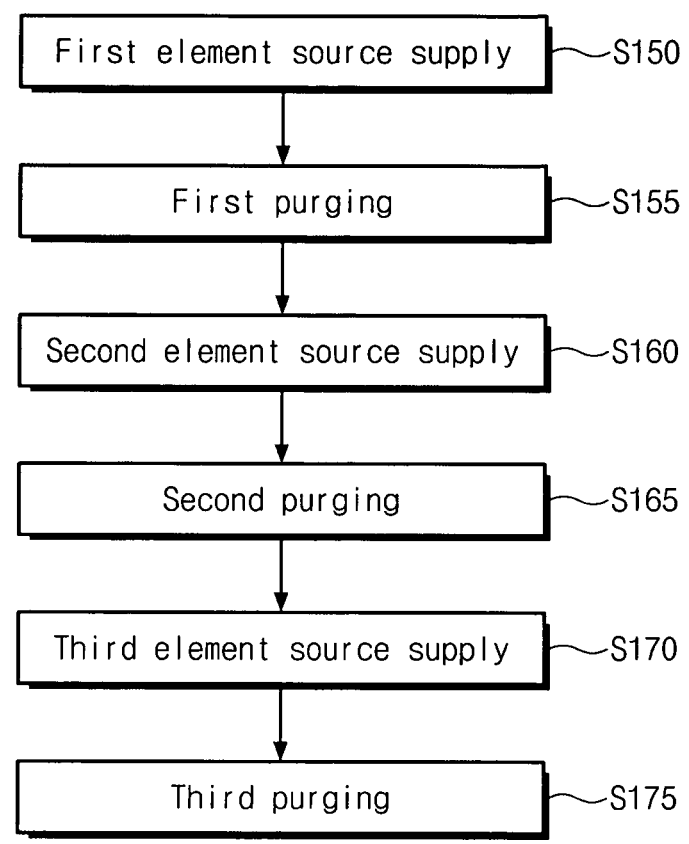
FIG. 4 illustrates a flow chart of a method of forming a multi-element insulating layer in accordance with an embodiment.

A multi-element insulating layer 110 may be formed on the substrate 100 having the interface layer 105. A method of forming the multi-element insulating layer 110 will be described referring to the flow chart of FIG. 4. FIG. 4 illustrates a flow chart of a method of forming a multi-element insulating layer in accordance with an embodiment.

Referring to FIGS. 1A, 1B and 4, a first element source may be supplied to the substrate 100 (S150). The substrate 100 may be loaded into a process chamber and the first element source may be supplied to the process chamber to supply the first element source to the substrate 100. The substrate 100 may include the interface layer 105 or the nitrogen treated interface layer 105. The first element source may be a source including a first element, and may be in a gaseous state. The supplied first element source may adsorb onto the substrate 100. The first element source may adsorb onto the interface layer 105 and/or the device isolation pattern 102. A portion of the first element source may be adsorbed onto the substrate 100, and another portion of the first element source may be not adsorbed to the substrate 100.

A first purging (S155) may be performed on the substrate 100. The non-adsorbed portions of the first element source may be removed by purging. The first purging (S155) may be performed by supplying a first purging gas including an inert gas, e.g., argon, to the process chamber.

A second element source may then be supplied to the substrate 100 (S160). The second element source may be supplied to the substrate 100 by supplying the second element source to the process chamber. The second element source may be a source including a second element, and may be in a gaseous state. The second element source may react with the portion of the first element source adsorbed onto the substrate in S150. As a result, a first element-second element compound may be formed on the active region and the device isolation pattern 102. The first element-second element compound may be formed on the interface layer 105.

A second purging (S165) may then be performed on the substrate 100. Unreacted second element source and/or first reaction residual may be discharged from the process chamber by the second purging (S165). The second purging (S165) may be performed by supplying a second purging gas including an inert gas, e.g., argon, to the process chamber. The first reaction residual may include, e.g., a residual generated by a reaction of the adsorbed first element source and the supplied second element source.

A third element source may then be supplied to the substrate 100 (S170). The third element source may be a source including a third element, and may be in a gaseous state. The third element source may be supplied to the substrate 100 by supplying the third element source to the process chamber. The third element source may react with the first element-second element compound. As a result, a multi-element insulating layer 110 including the first, second, and third elements may be formed. The multi-element insulating layer 110 may be formed on the active region and the device isolation pattern 102. The interface layer 105 may be between the multi-element insulating layer 110 and the active region. One of the first, second, and third element sources may be a silicon source, another may be a nitrogen source, and the other may be an oxygen source.

After the multi-element insulating layer 110 is formed, a third purging (S175) may be performed the substrate 100. Unreacted third element source and/or a second reaction residual may be purged from the process chamber by the third purging (S175). That is, the unreacted third element source and/or the second reaction residual may be removed by the third purging (S175). The second reaction residual may include, e.g., a residual generated by a reaction of the first element-second element compound and the third element source. The third purging (S175) may be performed by supplying a third purging gas including an inert gas, e.g., argon, to the process chamber. The multi-element insulating layer 110 may be included in a tunnel insulating layer (120 of FIGS. 2A and 2B). The interface layer 105 may be included in the tunnel insulating layer.

As described above, the multi-element insulating layer 110 may be formed by sequentially supplying the first, second, and third element sources to the process chamber housing the substrate 100. Accordingly, an element content ratio of the multi-element insulating layer 110 may be optimized. In other words, the element content ratio of the multi-element insulating layer 110 may be substantially uniform, or localized element content ratios in the multi-element insulating layer 110 may be easily controlled. Also, the multi-element insulating layer 110 may have superior thickness uniformity by supplying the first, second, and third element sources in sequence. As a result, the multi-element insulating layer 110 having a superior characteristic may be embodied. Thus, the tunnel insulating layer (120 of FIGS. 2A and 2B) having a superior characteristic may be embodied.

In a typical insulating layer formed by supplying three kinds of element sources simultaneously, a characteristic of the insulating layer may be deteriorated. Reaction temperatures of the three kinds of element sources may be different from one another, but a process temperature for depositing the insulating layer may be a maximum temperature among the reaction temperatures of the three kinds of element sources. As a result, since a reaction rate of one of the element sources of relatively low reaction temperature may be increased, it may be difficult to control the element content ratio of the insulating layer. Also, since it may be difficult to control reaction rates of three kinds of element sources, thickness uniformity of the insulating layer may be deteriorated.

In particular, if the silicon source, nitrogen source, and oxygen source are simultaneously supplied, the nitrogen source having a relatively low reaction temperature may very actively react due to a high deposition process temperature, such that the nitrogen content of the silicon oxynitride layer may become undesirably high. The oxygen content of the silicon oxynitride layer may thereby become very low. As a result, the oxygen content of the silicon oxynitride layer formed by simultaneously supplying silicon, nitride, and oxygen sources may not be greater than about 30 at. % (30 atomic %).

However, according to an embodiment, since the multi-element insulating layer 110 may be formed by supplying the first, second, and third element sources in sequence, the multi-element insulating layer 110 may have superior characteristics and/or superior thickness uniformity.

The steps of S150 to S175 described above may be defined as one cycle. The multi-element insulating layer 110 may be formed by repeatedly performing the cycle. The cycle may be repeated until a target thickness of the multi-element insulating layer 110 is obtained. The element content ratio of the multi-element insulating layer 110 may be very easily controlled by controlling the amount of element sources supplied to the substrate during the cycles.

As described above, one of the first, second, and third element sources may be the silicon source, another may be the nitrogen source, and the third may be the oxygen source. Accordingly, the multi-element insulating layer 110 may include a silicon oxynitride layer. The silicon source, the nitrogen source, and the oxygen source may be supplied in various orders. In an implementation, one of the first and second element sources may be the silicon source, and the other may be the nitrogen source. The third element source may be the oxygen source. The silicon source may include, e.g., a silicon-chlorine compound gas and/or a silicon-hydrogen-chlorine compound gas. In an implementation, the silicon source may include, e.g., $SiH_2Cl_2$, $SiCl_4$, and/or $Si_2Cl_6$. The nitrogen source may include, e.g., a $NH_3$ gas. The oxygen source may include, e.g., $O_2$, $N_2O$, and/or NO gas. In an implementation, the silicon source may include $Si_2Cl_6$, the nitrogen source may include $NH_3$, and the oxygen source may include $N_2O$.

When the multi-element insulating layer 110 is formed by performing a plurality of cycles, the amounts of the silicon, nitrogen, and oxygen sources supplied during the cycles may all be equal to one another. Accordingly, in an embodiment, the multi-element insulating layer 110 may have substantially uniform contents of silicon, nitrogen, and oxygen. In another embodiment, the silicon, nitrogen, and oxygen content of the multi-element insulating layer 110 of the multi-element insulating layer 110 may be locally controlled by controlling the amounts of element sources supplied during the cycles.

In the case that the multi-element insulating layer 110 includes a silicon oxynitride layer, the oxygen content of the multi-element insulating layer 110 may be about 30 at. % to about 60 at. %. The silicon content may be about 33.3 at. % to about 42 at. %, and the nitrogen content may be about 6.7 at. % to about 36.7 at. %. The sum of the oxygen, nitrogen, and silicon content is 100 at. %. Maintaining the oxygen content in the multi-element insulating layer 110 at about 30 at. % to about 60 at. % may help ensure that bulk traps in the multi-element insulating layer 110 are reduced.

According to another embodiment, one of the first, second, and third element sources may be a hafnium source, another may be the silicon source, and the other may be the oxygen source. Accordingly, the multi-element insulating layer 110 may include a hafnium-silicon oxide layer.

Referring to FIGS. 2A and 2B, after forming the multi-element insulating layer 110, an annealing process may be performed on the multi-element insulating layer 110. Bulk traps in the multi-element insulating layer 110 may be further reduced by the annealing process. The annealing process may be performed using a process gas including, e.g., oxygen ($O_2$), ozone ($O_3$), nitrogen ($N_2$), nitric oxide (NO), nitrous oxide ($N_2O$), chlorine (Cl), and/or fluorine (F) in the ambient atmosphere.

A capping insulating layer 115 may be formed on the multi-element insulating layer 110. The capping insulating layer 115 may be formed during the annealing process. In an embodiment, when the process gas of the annealing process includes a gas containing an oxygen atom, e.g., oxygen ($O_2$), ozone ($O_3$), nitric oxide (NO) and/or nitrous oxide ($N_2O$), an upper portion of the multi-element insulating layer 110 may oxidize to form the capping insulating layer 115. In another embodiment, when the process gas of the annealing process includes chlorine (Cl) and/or fluorine (F), an upper portion of the multi-element insulating layer 110 may be formed into the capping insulating layer 115 containing chlorine (Cl) and/or fluorine (F).

Alternatively, the capping insulating layer 115 may not be formed by the annealing process. For example, the annealing process may be performed at a temperature at which the process gas of the annealing process does not react to reduce bulk traps in the multi-element insulating layer 110. In this case, the capping insulating layer 115 may be deposited using, e.g., a chemical vapor deposition (CVD) method or an atomic layer deposition (ALD) method. The deposited capping insulating layer 115 may include an insulating material having an electron affinity less than an electron affinity of a portion of the multi-element insulating layer 110. The deposited capping insulating layer 115 may include, e.g., a silicon oxide layer.

The tunnel insulating layer 120 may include the interface layer 105, the multi-element insulating layer 110, and the capping insulating layer 115. In an implementation, the interface layer 105 and/or the capping insulating layer 115 may be omitted.

Referring to FIGS. 3A and 3B, a charge storage layer 125, a blocking insulating layer 130, and a control gate conductive layer 135 may be sequentially formed on the tunnel insulating layer 120. The charge storage layer 125 may include an insulating material having traps capable of storing charges. The charge storage layer 125 may include, e.g., silicon nitride and/or nano dots for the traps. The nano dots may include, e.g., a semiconductor and/or a metal, and may be distributed in an insulating material, e.g., an oxide. If the charge storage layer 125 includes an insulating material having traps storing charges, the charge storage layer 125 may be formed on the entire front side of the substrate 100 as shown in FIGS. 3A and 3B.

In another embodiment, the charge storage layer 125 may include a semiconductor material being doped with a dopant, e.g., doped silicon, doped germanium, doped silicon-germanium, etc., or an undoped semiconductor material, e.g., undoped silicon, undoped germanium, undoped silicon-germanium, etc. In these cases, the charge storage layer 125 may be formed only on the active region. That is, the charge storage layer 125 may not be formed on the device isolation pattern 102. This allows for a node separation of non volatile memory cells adjacent to one another with respect to the device isolation pattern 102. If the charge storage layer 125 includes the doped semiconductor material, the dopant in the charge storage layer 125 may be the same type of dopant as in a channel region in the active region. The dopant in the channel region and the dopant in the charge storage layer 125 may both be a p-type dopant, e.g., boron, etc. Alternatively, the dopant in the channel region and the dopant in the charge storage layer 125 may both be an n-type dopant. Majority carriers generated by the dopant in the charge storage layer 125 may be of a different type from charges stored in the charge storage layer 125. For example, the majority carriers in the charge storage layer 125 may be holes, and charges stored in the charge storage layer 125 may be electrons.

In an implementation, the dopant in the charge storage layer 125 may be of a different type from the dopant in the channel region. For example, one of the dopant in the charge storage layer 125 and the dopant in the channel region may be an n-type dopant and the other may be a p-type dopant.

The blocking insulating layer 130 may include a high dielectric material having a dielectric constant higher than an oxide and/or the tunnel insulating layer 120. According to an embodiment, when the tunnel insulating layer 120 is a multilayer, e.g., interface layer 105, multi-element insulating layer 110, and capping insulating layer 115, the high dielectric material may have a dielectric constant higher than the layer of the tunneling insulating layer 120 having the highest dielectric constant. The high dielectric material may include, e.g., SiN, AlO, $Al_2O_3$, $HfO_2$, $La_2O_3$, $HfAl_xO_y$, HfAlON, $HfSi_xO_y$, HfSiON, $ZrO_2$, $ZrSi_xO_y$, $Ta_2O_3$, $TiO_2$, PZT, $PbTiO_3$, $PbZrO_3$, PbO, $SrTiO_3$, $BaTiO_3$, $V_2O_5$, (Ba, Sr)$TiO_3$ (BST), and/or $SrBi_2Ta_2O_9$ (SBT).

The control gate conductive layer 135 may be formed of a conductive material. According to an embodiment, the control gate conductive layer 135 may include a conductive material having a work function of at least about 4.0 eV. The control gate conductive layer 135 may include, e.g., Ti, TiN, TaTi, TaSiN, Ta, W, Hf, HfN, Nb, Mo, $RuO_2$, RuO, $Mo_2N$, WN, WSi, $Ti_3Al$, $Ti_2AlN$, Pd, Ir, Pt, Co, Cr, CoSi, and/or AlSi. The control gate conductive layer 135 may include a conductive material having a work function greater than about 4.0 eV, thereby minimizing the amount of charges capable of tunneling through the blocking insulating layer 130 from a control gate electrode formed in a subsequent process. Accordingly, program efficiency of a nonvolatile memory device may be improved.

Figure 5A:
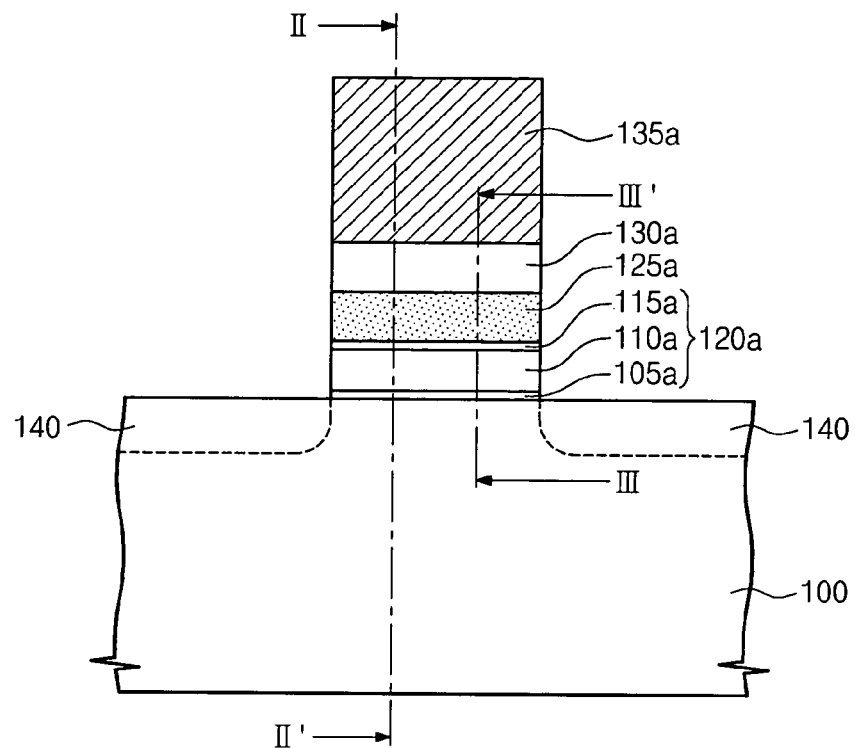
FIG. 5A illustrates a cross sectional view of a nonvolatile memory device in accordance with an embodiment.
Figure 5B:
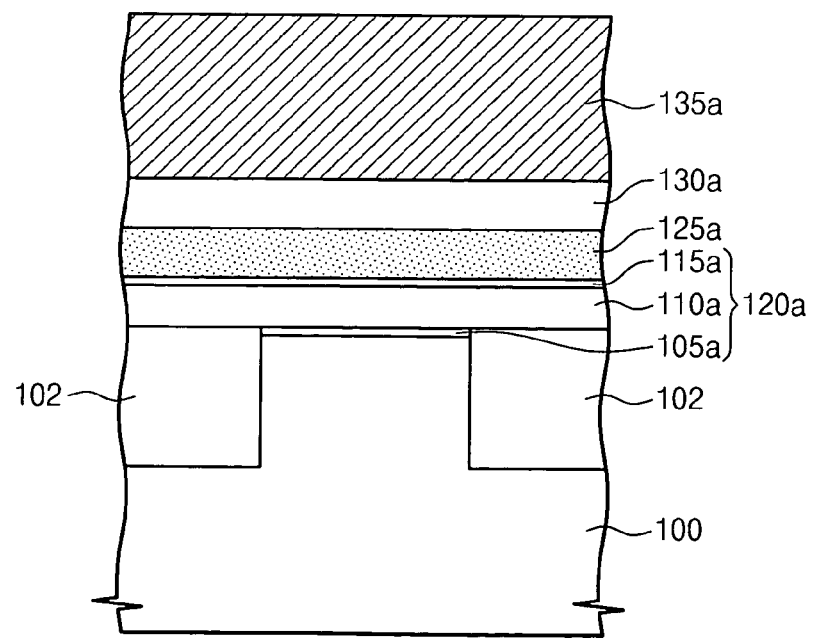
FIG. 5B illustrates a cross section view taken along the line II-II' of FIG. 5A.

Referring to FIGS. 5A and 5B, the control gate conductive layer 135 may be patterned to form a control gate electrode 135a. The control gate conductive layer 135, the blocking insulating layer 130, the charge storage layer 125, and the tunnel insulating layer 120 may be successively patterned. In this case, a tunnel insulating pattern 120a, a charge storage pattern 125a, a blocking insulating pattern 130a and the control gate electrode 135a may be sequentially formed. The tunnel insulating pattern 120a may include a sequentially stacked interface pattern 105a, multi-element insulating pattern 110a, and capping insulating pattern 115a.

When the charge storage layer 125 is formed of an insulating material having traps for storing charges, the control gate conductive layer 135 may be patterned using the blocking insulating layer 130 as an etching stop layer to form the control gate electrode 135a. In this case, the blocking insulating layer 130, the charge storage layer 125, and the tunnel insulating layer 120 may extend from both sides of the control gate electrode 135a.

A source/drain 140 may be disposed in the active region adjacent to both sides of the control gate electrode 135a. The source/drain 140 may be formed by implanting dopant ions into the active region using the control gate electrode 135a as a mask. In another embodiment, the source/drain 140 may be an inversion layer generated by a fringe electric field of the control gate electrode 135a during an operation of the nonvolatile memory device.

According to an embodiment described above, the multi-element insulating layer 110 in the tunnel insulating layer 120 may be formed on the substrate by sequentially supplying the first element source, second element source, and third element source to, e.g., the process chamber housing the substrate. Thus, the element content ratio of the multi-element insulating layer 110 may be easily controlled. Also, the multi-element insulating layer 110 may have superior thickness uniformity. Consequentially, the tunnel insulating layer 120 may have a superior characteristic, thereby embodying a nonvolatile memory device optimized for a high level of integration. Also, the nonvolatile memory device may have superior reproducibility. In addition, the nonvolatile memory device may have superior data retention by minimizing the amount of bulk traps in the multi-element insulating layer 110.

Next, a nonvolatile memory device according to an embodiment will be described with reference to the drawings. FIG. 5A illustrates a cross sectional view of a nonvolatile memory device in accordance with an embodiment. FIG. 5B illustrates a cross section view taken along the line II-II' of FIG. 5A.

Referring to FIGS. 5A and 5B, the device isolation pattern 102 defining the active region may be disposed in the substrate 100, and the tunnel insulating pattern 120a may be disposed on the active region. The tunnel insulating pattern 120a may include the multi-element insulating pattern 110a. The tunnel insulating pattern 120a may further include the interface pattern 105a disposed between the multi-element insulating pattern 110a and the active region, and/or the capping insulating pattern 115a on the multi-element insulating pattern 110a.

The charge storage pattern 125a may be disposed on the tunnel insulating pattern 120a. The blocking insulating pattern 130a may be disposed on the charge storage pattern 125a. The control gate electrode 135a may be disposed on the blocking insulating pattern 130a. The control gate electrode 135a may cross the active region. The channel region may be defined in the active region under the control gate electrode 135a. The source/drain 140 may be disposed in the active region at sides of the control gate electrode 135a. The multi-element insulating pattern 110a may extend between the control gate electrode 135a and the device isolation pattern 102. The tunnel insulating pattern 120a, the charge storage pattern 125a, and the blocking insulating pattern 130a may extend at sides of the control gate electrode 135a to cover the source/drain 140.

As described above, the multi-element insulating pattern 110a may be formed on the substrate 100 by sequentially supplying the first, second, and third element sources, so that the element content ratio of the multi-element insulating pattern 110a may be efficiently and easily controlled.

Figure 6:
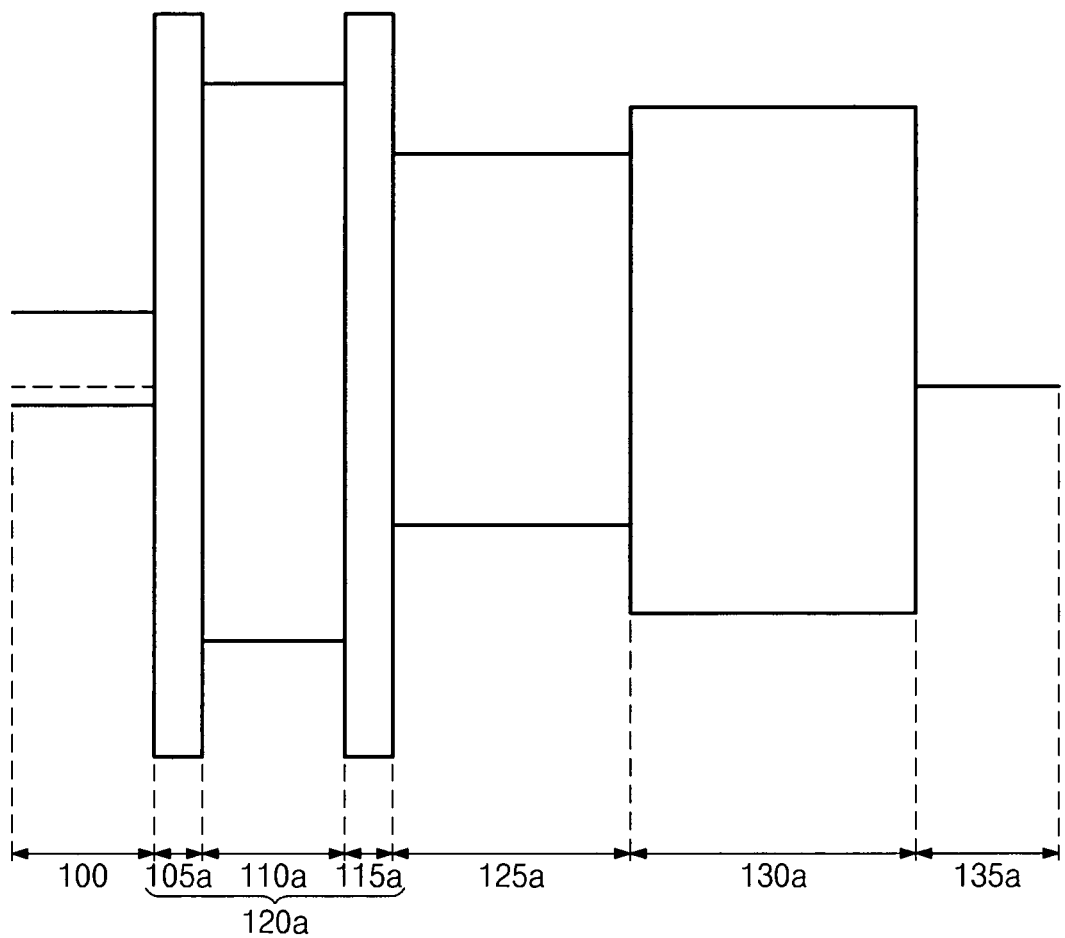
FIG. 6 illustrates an energy band diagram taken along the line III-III' of FIG. 5A, the energy band diagram showing a nonvolatile memory device in accordance with an embodiment.

A nonvolatile memory device according to an embodiment will be described referring to an energy band diagram of FIG. 6. FIG. 6 illustrates an energy band diagram taken along the line III-III' of FIG. 5A, the energy band diagram illustrating a nonvolatile memory device in accordance with an embodiment. Referring to FIGS. 5A and 6, the energy band diagram represents a state of equilibrium. As depicted in FIG. 6, according to an embodiment, the multi-element insulating layer 110a in the tunnel insulating pattern 120a may have a substantially uniform energy band gap. Element content ratios of the multi-element insulating pattern 110a may be substantially uniform due to, e.g., sequentially supplying the first, second, and third element sources during formation of the multi-element insulating layer 110. Accordingly, the multi-element insulating pattern 110a may have a substantially uniform energy band gap.

An electron affinity of the multi-element insulating pattern 110a may be less than an electron affinity of the charge storage pattern 125a. Accordingly, undesirable leakage of charges stored in the charge storage pattern 125a to the active region due to an electric potential barrier generated by the multi-element insulating pattern 110a may be minimized. The electron affinity of the multi-element insulating pattern 110a may be defined by a potential difference between lower edges of a conduction band of the multi-element insulating pattern 110a and a vacuum level. The multi-element insulating pattern 110a may be formed by a method described with reference to FIGS. 1A, 1B, 2A, and 2B, thereby reducing bulk traps in the multi-element insulating pattern 110a. As a result, undesirable leakage of charges in the charge storage pattern 125a to the active region through bulk traps in the tunnel insulating pattern 120a may be minimized. Consequently, the nonvolatile memory device may exhibit superior data retention.

An electron affinity of the interface pattern 105a and/or an electron affinity of the capping insulating pattern 115a may be less than the electron affinity of the charge storage pattern 125a. The electron affinity of the multi-element insulating pattern 110a may be greater than the electron affinity of the interface pattern 105a and/or the capping insulating pattern 115a. In other words, the electron affinity of the multi-element insulating pattern 110a may be greater than the electron affinities of the interface pattern 105a and/or the capping insulating pattern 115a, and less than the electron affinity of the charge storage pattern 125a. Accordingly, program efficiency may be improved. For example, during a program operation, charges of the substrate 100 may tunnel (e.g., FN tunneling) the tunnel insulating pattern 120a to be stored in the charge storage pattern 125a. An electric potential barrier of the multi-element insulating pattern 110a may be lower than electric potential barriers of the interface pattern 105a and/or the capping insulating pattern 110a. Thus, during a program operation, a tunneling probability of the charges through the tunnel insulating pattern 120a may increase. As a result, program efficiency of the nonvolatile memory device may be improved.

Consequently, program efficiency of the nonvolatile memory device may be improved together with an improvement of data retention characteristic of the nonvolatile memory device by the multi-element insulating pattern 110a. An improvement in program efficiency may result in a nonvolatile memory device having desirably low power consumption.

As described above, the multi-element insulating pattern 110a may include a silicon oxynitride layer. The oxygen content of the multi-element insulating pattern 110a may be about 30 at. % to about 60 at. %. Bulk traps in the multi-element insulating pattern 110a may be reduced by a high oxygen content. Also, bulk traps in the multi-element insulating pattern 110a may be further reduced by the annealing process described with reference to FIGS. 2A and 2B. As a result, leakage of charges through bulk traps of the multi-element insulating pattern 110a may be minimized, thereby improving data retention of the nonvolatile memory device.

An electron affinity of the blocking insulating pattern 130a may be less than the electron affinity of the charge storage pattern 125a. Thus, undesirable leakage of charges stored in the charge storage pattern 125a through the blocking insulating pattern 130a at a data retention node may be minimized.

Figure 7A:
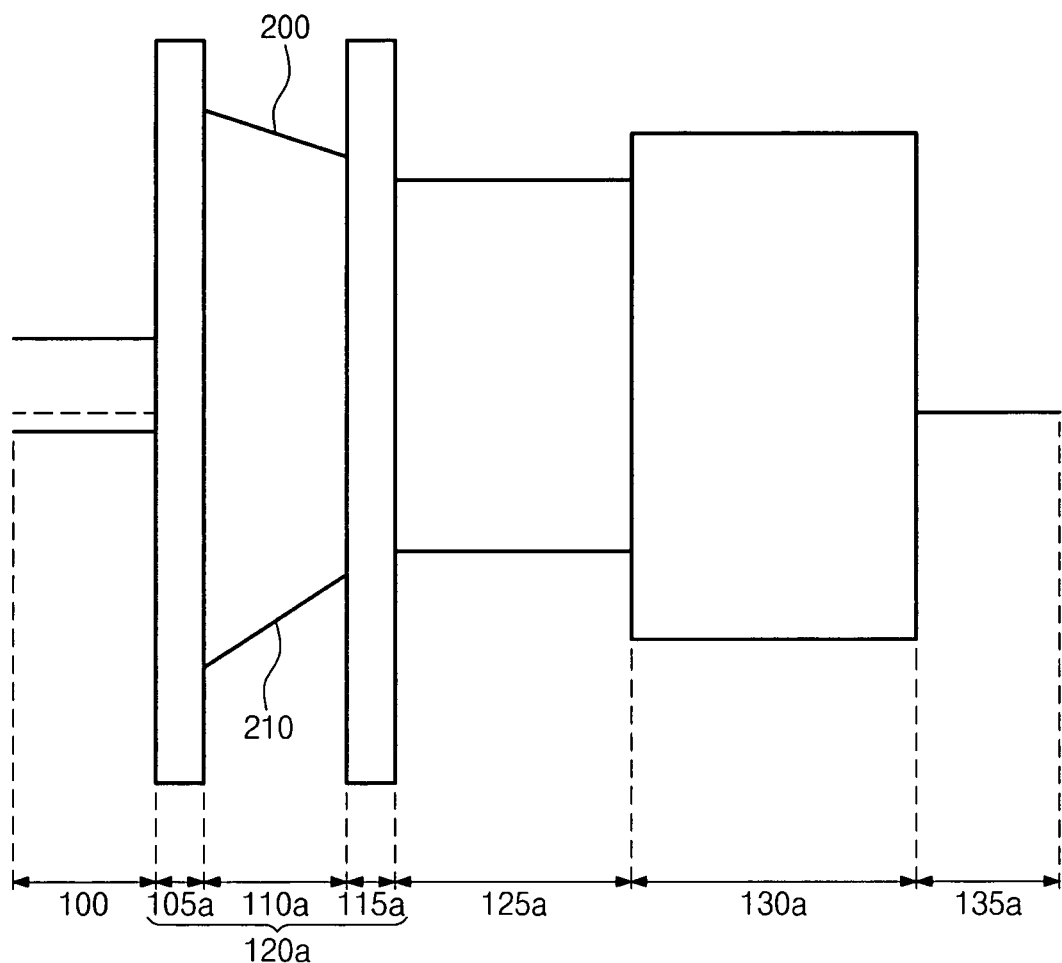
FIG. 7A illustrates an energy band diagram taken along the line III-III' of FIG. 5A, the energy band diagram showing a nonvolatile memory device in accordance with another embodiment.

In an embodiment, an energy band gap of the multi-element insulating pattern 110a may not be uniform. For example, an energy band gap of a bottom surface of the multi-element insulating pattern 110a may be different from an energy band gap of a top surface of the multi-element insulating pattern 110a. This will be described with reference to the drawings. FIG. 7A illustrates an energy band gap diagram taken along the line III-III' of FIG. 5A, the energy band gap diagram illustrating a nonvolatile memory device in accordance with another embodiment.

Referring to FIGS. 5A and 7A, the energy band gap of the bottom surface of the multi-element insulating pattern 110a may be greater than the energy band gap of the top surface of the multi-element insulating pattern 110a. The energy band gap of the multi-element insulating pattern 110a may gradually decrease from the bottom surface of the multi-element insulating pattern 110a to the top surface of the multi-element insulating pattern 110a. As depicted in FIG. 7A, the energy band gap of the multi-element insulating pattern 110a may substantially linearly decrease. The electron affinity of the bottom surface of the multi-element insulating pattern 110a may be greater than the electron affinity of the interface pattern 105a and/or the capping insulating pattern 115a. The electron affinity of the top surface of the multi-element insulating pattern 110a may be less than the electron affinity of the charge storage pattern 125a.

The multi-element insulating pattern 110a of FIG. 7A may be formed by repeatedly performing the cycle (S150 through S175) described with reference to FIG. 4. The multi-element insulating pattern 110a of FIG. 7A may be formed by varying the amount of at least one element source supplied to, e.g., the process chamber, during the cycles.

The multi-element insulating pattern 110a of FIG. 7A may include a silicon oxynitride layer. In this case, the amount of the oxygen source supplied during the first cycle among the cycles may be larger than the amount of the oxygen source supplied during the last cycle among the cycles. The cycles may include at least one middle cycle between the first and last cycles. The amount of the oxygen source supplied during the middle cycle may be less than the amount of the oxygen source supplied during a cycle performed just before the middle cycle. Accordingly, as the multi-element insulating pattern 110a approaches the capping insulating pattern 115a, the oxygen content of the multi-element insulating pattern 110a may gradually decrease. As a result, the energy band gap of the multi-element insulating pattern 110a may gradually decrease. In particular, the energy band gap of the multi-element insulating pattern 110a may substantially linearly decrease by decreasing the amount of the oxygen source supplied to each of the cycles by a specific amount. The oxygen content of the multi-element insulating ratio 110a may be about 30 at. % to about 60 at. %. That is, the minimum oxygen content of the multi-element insulating pattern 110a may be equal to or greater than about 30 at. % and less than about 60 at. %. The maximum oxygen content ratio of the multi-element insulating pattern 110a may be equal to or less than about 60 at. % and greater than about 30 at. %. The amounts of the silicon source supplied during the cycles may be equal to one another. The amounts of the nitrogen source supplied during the cycles may also be equal to one another. In another embodiment, the amounts of the silicon source supplied during the cycles may be different from one another. The amounts of the nitrogen source supplied during the cycles may also be different from one another.

According to an embodiment, as depicted in FIG. 7A, an absolute value of a slope (hereinafter, "slope") of an upper edge 210 of a valence band may be greater than the slope of a lower edge 200 of a conduction band in the multi-element insulating pattern 110a. That is, the upper edge 210 of the valence band may change more steeply than the lower edge 200 of the conduction band.

Figure 7B:
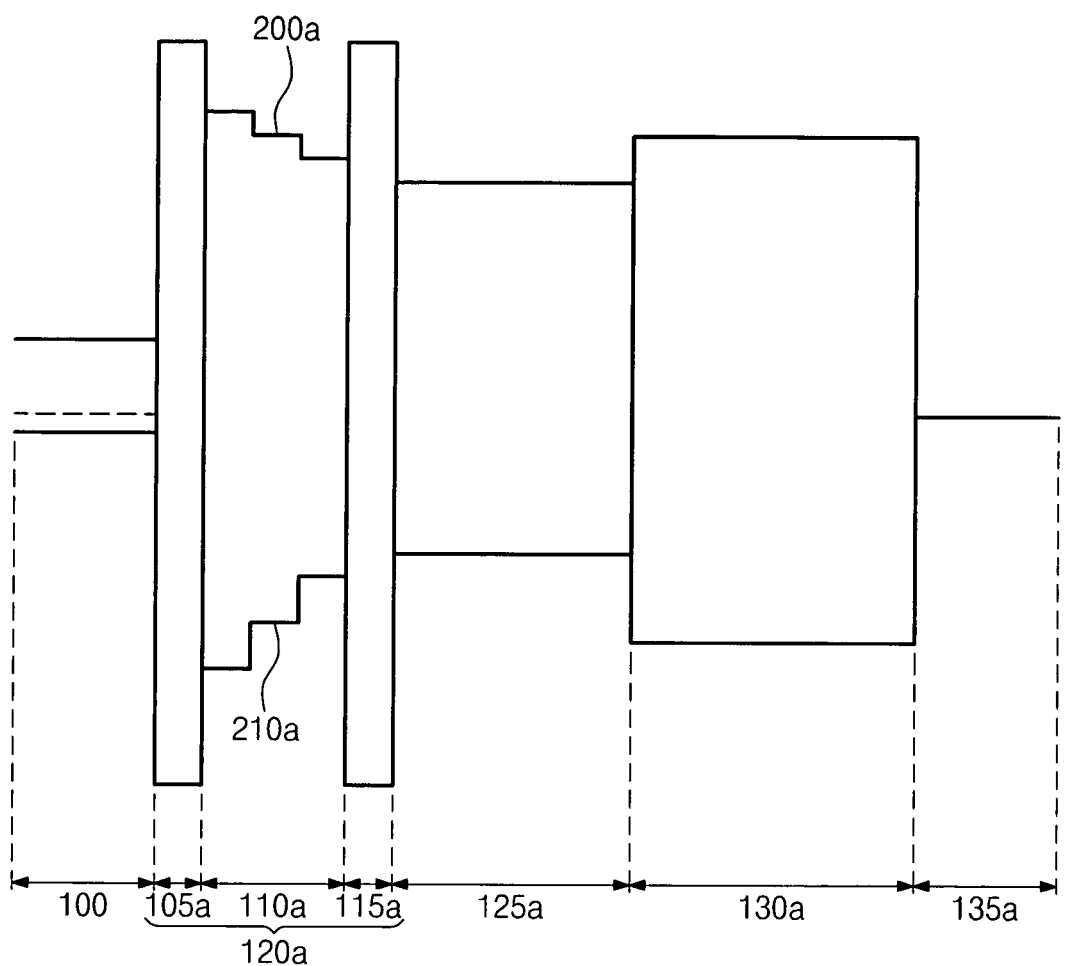
FIG. 7B illustrates an energy band diagram taken along the line III-III' of FIG. 5A, the energy band diagram showing a modified example of a nonvolatile memory device in accordance with the embodiment shown in FIG. 7A.

The energy band gap of the multi-element insulating pattern 110a of FIG. 7A described above may decrease substantially linearly. In another embodiment, the energy band gap of the multi-element insulating pattern 110a may decrease in stages, as will be described with reference to the drawings. FIG. 7B illustrates an energy band diagram taken along the line III-III' of FIG. 5A, the energy band diagram showing a modified example of a nonvolatile memory device in accordance with another embodiment.

Referring to FIGS. 5A and 7B, as the multi-element insulating pattern 110a approaches the capping insulating pattern 115a, the energy band gap of the multi-element insulating pattern 110a may decrease stepwise.

The multi-element insulating pattern 110a of FIG. 7B may be formed by repeatedly performing the cycle (S150 through S175) described referring to FIG. 4. The cycles may be divided into sub-cycle groups. Each of the sub-cycle groups may include two or more cycles, and the amounts of the element sources supplied during the cycles in each of the sub-cycle groups may be equal to one another. The amounts of at least one element source supplied during each of the sub-cycle groups may be changed by a specific amount.

The multi-element insulating pattern 110a of FIG. 7B may include a silicon oxynitride layer. In this case, the amount of the oxygen source supplied during the first sub-cycle group among the sub-cycle groups may be larger than the amount of the oxygen source supplied during the last sub-cycle group among the sub-cycle groups. The sub-cycle groups may include at least one middle sub-cycle group between the first and last sub-cycle groups. The amount of the oxygen source supplied during the middle sub-cycle group may be less than the amount of the oxygen source supplied during a sub-cycle group performed just before the middle sub-cycle group. Accordingly, as the multi-element insulating pattern 110a approaches the capping insulating pattern, the oxygen content of the multi-element insulating pattern 110a may decrease stepwise. As a result, the energy band gap of the multi-element insulating pattern 110a may decrease in stages as depicted in FIG. 7B. The oxygen content of the multi-element insulating ratio 110a of FIG. 7B may be about 30 at. % to about 60 at. %. The minimum oxygen content of the multi-element insulating pattern 110a may be equal to or greater than about 30 at. % and less than about 60 at. %. The maximum oxygen content of the multi-element insulating pattern 110a may be equal to or less than about 60 at. % and greater than about 30 at. %. The amounts of the silicon source supplied during the sub-cycle groups may be equal to one another. The amounts of the nitrogen source supplied during the sub-cycle groups may also be equal to one another. In another embodiment, the amounts of the silicon source supplied during the sub-cycle groups may be different from one another. The amounts of the nitrogen source supplied during the sub-cycle groups may also be different from one another. Since the multi-element insulating pattern 110a may include a silicon oxynitride layer, the overall slope of an upper edge 210a of a valance band may be greater than the overall slope of a lower edge 200a of a conduction band in the multi-element insulating pattern 110a of FIG. 7B.

As described above, according to embodiments illustrated in FIGS. 7A and 7B, the energy band gap of the multi-element insulating pattern 110a may decrease linearly or stepwise. Thus, the multi-element insulating pattern 110a may include a portion, e.g., a bottom surface, having a relatively high electric potential barrier and another portion, e.g., a top surface, having a relatively low electric potential barrier. Accordingly, programming efficiency may be improved. In other words, when charges of the substrate 100 tunnel the multi-element insulating pattern 110a, a thickness of a tunneling barrier may be reduced to increase a tunneling probability of charges.

Also, the upper edge 210 or 210a of the valence band of the multi-element insulating pattern 110a may incline more steeply than the lower edge 200 or 200a of the conduction band of the multi-element insulating pattern 110a. Thus, a probability of a hole tunneling the multi-element insulating pattern 110a may increase. As a result, an erasing mechanism of the nonvolatile memory device and/or a writing mechanism may be variously embodied. For example, when charges stored in the charge storage pattern 125a are electrons, charges of the charge storage pattern 125a may be discharged to the substrate 100 during an erase operation. Since the probability of a hole tunneling the multi-element insulating pattern 110a increases, holes of the substrate 100 may tunnel to the charge storage pattern 125a by way of the tunnel insulating pattern 100. Accordingly, program efficiency may be improved.

Figure 8A:
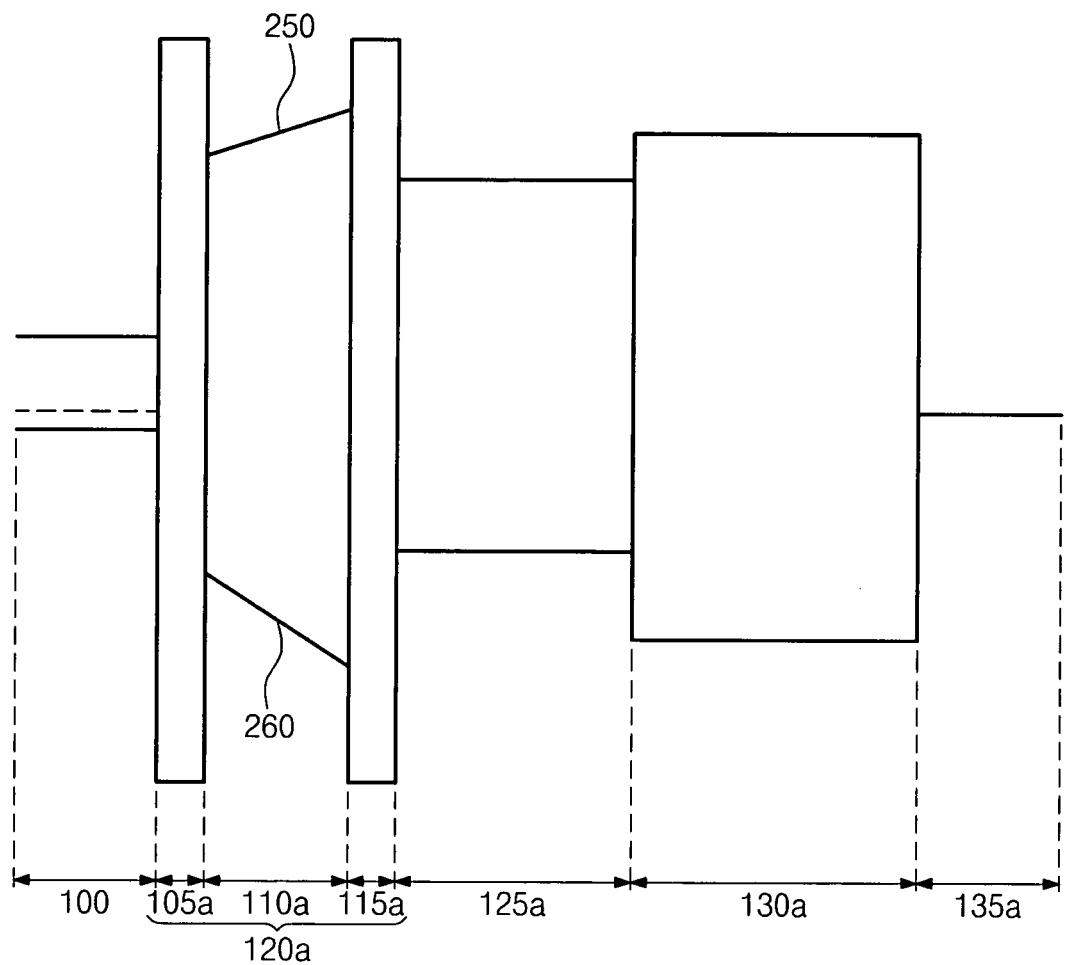
FIG. 8A illustrates an energy band diagram taken along the line III-III' of FIG. 5A, the energy band diagram showing a nonvolatile memory device in accordance with still another embodiment.

Alternatively, the energy band gap of the bottom surface of the multi-element insulating pattern 110a may be smaller than the energy band gap of the top surface of the multi-element insulating pattern 110a. FIG. 8A illustrates an energy band diagram taken along the line III-III' of FIG. 5A, the energy band diagram showing a nonvolatile memory device in accordance with still another embodiment. Referring to FIGS. 5A and 8A, the energy band gap of the bottom surface of the multi-element insulating pattern 110a may be smaller than the energy band gap of the top surface of the multi-element insulating pattern 110a. The energy band gap of the multi-element insulating pattern 110a may gradually increase from the bottom surface of the multi-element insulating pattern 110a to the top surface of the multi-element insulating pattern 110a. As depicted in FIG. 8A, the energy band gap of the multi-element insulating pattern 110a may increase substantially linearly. The electron affinity (minimum electron affinity) of the top surface of the multi-element insulating pattern 110a may be greater than the electron affinity of the interface pattern 105a and/or the capping insulating pattern 115a. The electron affinity (maximum electron affinity) of the bottom surface of the multi-element insulating pattern 110a may be less than the electron affinity of the charge storage pattern 125a.

The multi-element insulating pattern 110a of FIG. 8A may include a silicon oxynitride layer. The multi-element insulating pattern 110a of FIG. 8A may be formed by repeatedly performing the cycle (S150 through S175) described referring to FIG. 4. In this case, the amount of the oxygen source supplied during the first cycle among the cycles may be less than the amount of the oxygen source supplied during the last cycle among the cycles. The cycles may include at least one middle cycle between the first and last cycles. The amount of the oxygen source supplied during the middle cycle may be larger than the amount of the oxygen source supplied during a cycle performed just before the middle cycle. Accordingly, as the multi-element insulating pattern 110a approaches the capping insulating pattern, the oxygen content of the multi-element insulating pattern 110a may gradually increase. As a result, the energy band gap of the multi-element insulating pattern 110a may gradually increase. In particular, the energy band gap of the multi-element insulating pattern 110a may increase substantially linearly by increasing the amount of the oxygen source supplied during each of the cycles by the specific amount. The oxygen content of the multi-element insulating pattern 110a may be about 30 at. % to about 60 at. %. The minimum oxygen content of the multi-element insulating pattern 110a may be equal to or greater than about 30 at. % and less than about 60 at. %. The maximum oxygen content of the multi-element insulating pattern 110a may be equal to or less than about 60 at. % and greater than about 30 at. %. The amounts of the silicon source supplied during the cycles may be equal to one another. The amounts of the nitrogen source supplied during the cycles may also be equal to one another. In another embodiment, the amounts of the silicon source supplied during the cycles may be different from one another. The amounts of the nitrogen source supplied during the cycles may also be different from one another. Since the multi-element insulating pattern 110a may include a silicon oxynitride layer, as depicted in FIG. 8A, the slope of the upper edge of the valence band may be greater than the slope of the lower edge of the conduction band in the multi-element insulating pattern 110a.

Figure 8B:
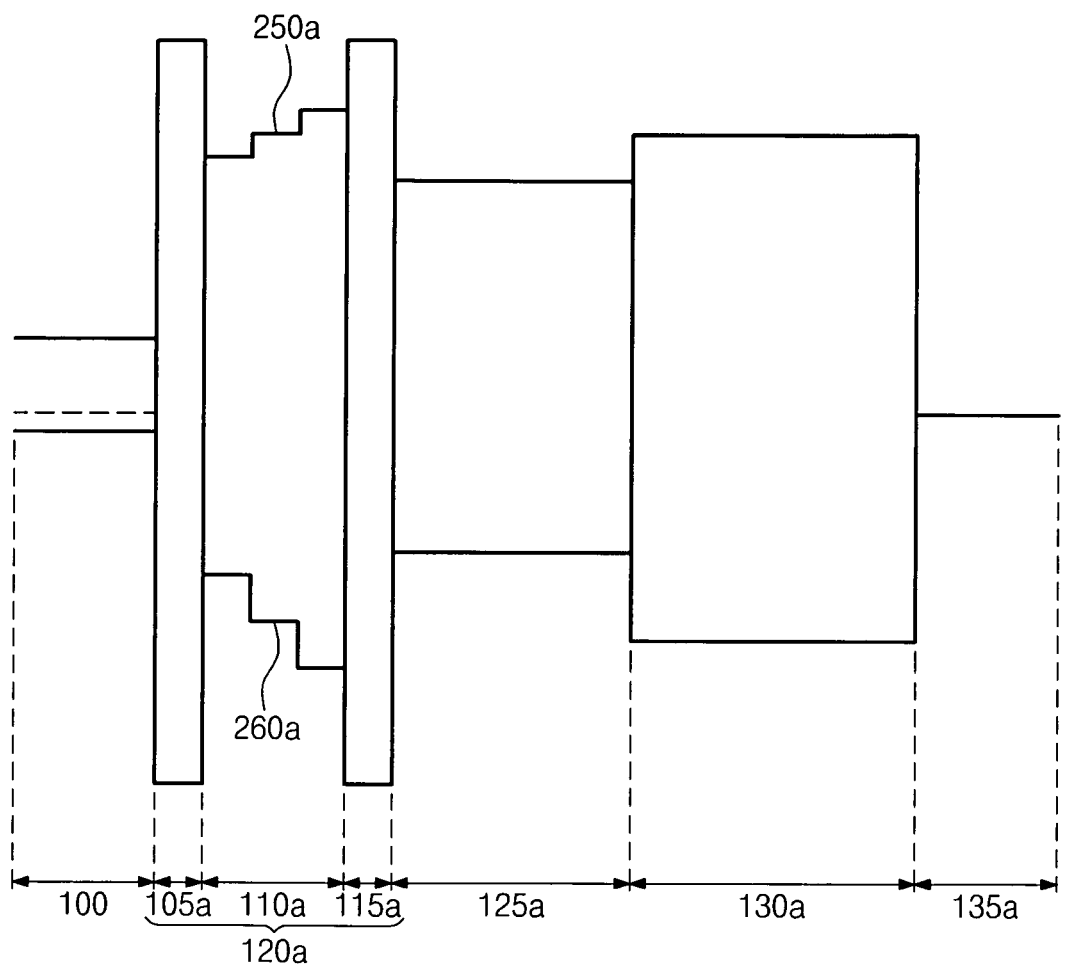
FIG. 8B illustrates an energy band diagram taken along the line III-III' of FIG. 5A, the energy band diagram showing a modified example of a nonvolatile memory device in accordance with the embodiment shown in FIG. 8A.

FIG. 8B illustrates an energy band diagram taken along the line III-III' of FIG. 5A, the energy band diagram showing a modified example of a nonvolatile memory device in accordance with still another embodiment. Referring to FIGS. 5A and 8B, the energy band gap of the multi-element insulating pattern 110a may increase stepwise from the bottom surface of the multi-element insulating pattern 110a to the top surface of the multi-element insulating pattern 110a. The multi-element insulating pattern 110a of FIG. 8B may be formed by repeatedly performing the cycle (S150 through S175) described referring to FIG. 4. The cycles may be divided into sub-cycle groups. Each of the sub-cycle groups may include two or more cycles, and the amount of the element source supplied during the cycles in each of the sub-cycle groups may be equal to one another. The amount of at least one element source supplied during the sub-cycle groups may be changed by the specific amount.

The multi-element insulating pattern 110a of FIG. 8B may include a silicon oxynitride layer. In this case, the amount of the oxygen source supplied during the first sub-cycle group among the sub-cycle groups may be less than the amount of the oxygen source supplied during the last sub-cycle group among the sub-cycle groups. The sub-cycle groups may include at least one middle sub-cycle group between the first and last sub-cycle groups. The amount of the oxygen source supplied during the middle sub-cycle group may be larger than the amount of the oxygen source supplied during a sub-cycle group performed just before the middle sub-cycle group. Accordingly, as the multi-element insulating pattern 110a approaches the capping insulating pattern 115a, the oxygen content of the multi-element insulating pattern 110a may increase stepwise. As a result, the energy band gap of the multi-element insulating pattern 110a may increase in stages as depicted in FIG. 8B. The oxygen content of the multi-element insulating pattern 110a of FIG. 8B may be about 30 at. % to about 60 at. %. The minimum oxygen content of the multi-element insulating pattern 110a may be equal to or greater than about 30 at. % and less than about 60 at. %. The maximum oxygen content of the multi-element insulating pattern 110a may be equal to or less than about 60 at. % and greater than about 30 at. %. The amounts of the silicon source supplied during the sub-cycle groups may be equal to one another. The amounts of the nitrogen source supplied during the sub-cycle groups may also be equal to one another. In another embodiment, the amounts of the silicon source supplied during the sub-cycle groups may be different from one another. The amounts of the nitrogen source supplied during the sub-cycle groups may also be different from one another. Since the multi-element insulating pattern 110a may include a silicon oxynitride layer, the overall slope of an upper edge 260a of a valance band may be greater than the overall slope of a lower edge 250a of a conduction band in the multi-element insulating pattern 110a of FIG. 8B.

The nonvolatile memory devices according to embodiments shown in FIGS. 8A and 8B described above may obtain the same beneficial effect as the nonvolatile memory devices described in FIGS. 7A and 7B. In addition, in the present embodiment, since a relatively high electrical potential barrier of the multi-element insulating pattern 110a adjoins the charge storage pattern 125a, leakage of data stored in the charge storage pattern 125a through the tunnel insulating pattern 120a may be further reduced.

Figure 8C:
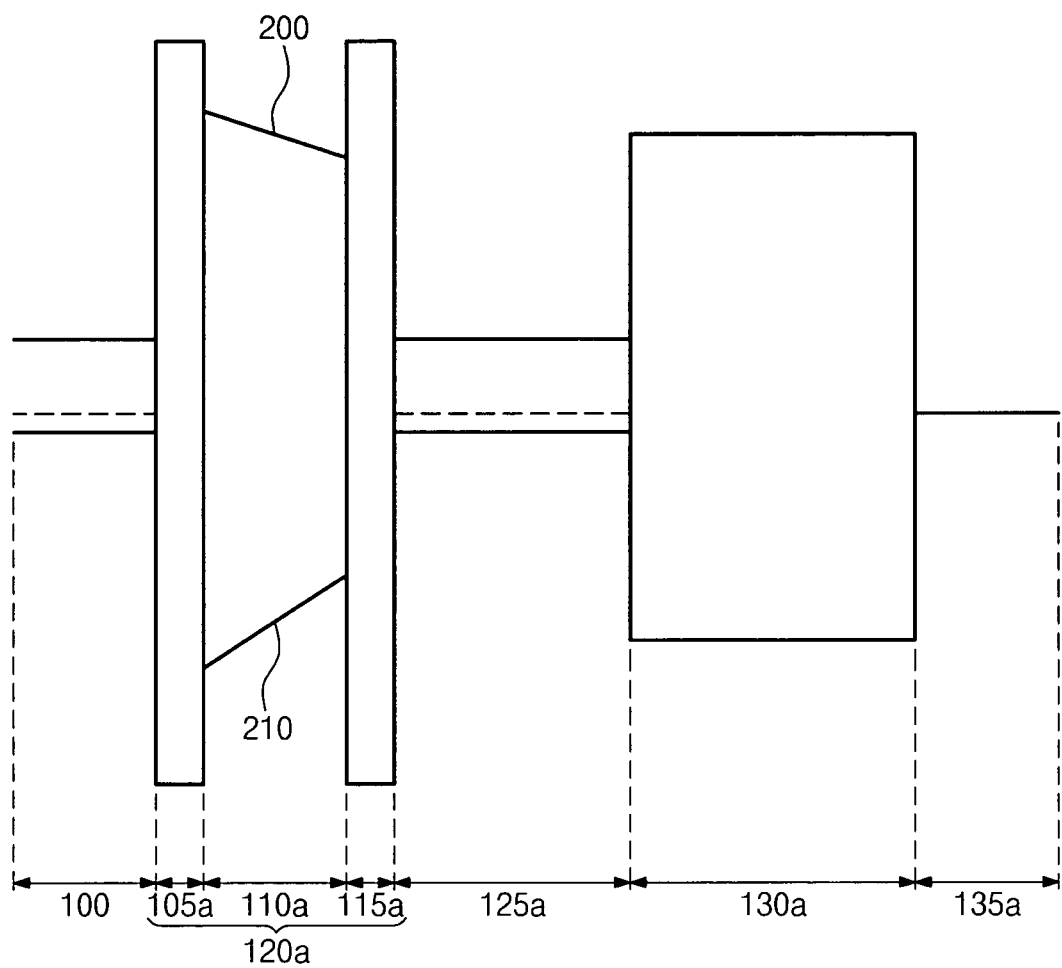
FIG. 8C illustrates an energy band diagram taken along the line III-III' of FIG. 5A, the energy band diagram showing a nonvolatile memory device in accordance with further still another embodiment.

Next, according to still another embodiment, the charge storage pattern 125a may include a doped semiconductor material. A dopant in the charge storage pattern 125a and a dopant in the channel region may be of the same type. This will be described with reference to the drawings. FIG. 8C illustrates an energy band diagram taken along the line III-III' of FIG. 5A, the energy band diagram showing a nonvolatile memory device in accordance with still another embodiment.

Referring to FIGS. 5A and 8C, the charge storage pattern 125a may include the doped semiconductor material including the dopant. The dopant in the charge storage pattern 125a may be the same as the dopant in the channel region under the control gate electrode 135a. For example, the charge storage pattern 125a and the channel region may be doped with p-type dopants. The channel region and the charge storage pattern 125a may be formed of, e.g., p-type silicon. Charges stored in the charge storage pattern 125a may be electrons. Since the charge storage pattern 125a may be doped with the p-type dopant, the electrons may be stored in a valence band of the charge storage pattern 125a. Therefore, a potential barrier for the charges in the charge storage pattern 125a may be generated as a band gap of the charge storage pattern 125a. As a result, data retention of a nonvolatile memory device may be improved.

Additionally, holes in the channel region in the substrate 100 may be injected into the charge storage pattern 125a including the p-type doped silicon during an erase operation. That is, electrons in the valence band of the charge storage pattern 125a may not tunnel through the tunnel insulating pattern 120a via a conduction band of the charge storage pattern 125a. As described above, the slope of the upper edge 210 of the valence band may be greater than the slope of the lower edge 200 of the conduction band in the multi-element insulating pattern 110a. Therefore, a width of the multi-element insulating pattern 110a tunneled by the holes in the channel region may be decreased. As a result, erasure efficiency of the nonvolatile memory device may be improved.

The multi-element insulating pattern 110a in FIG. 8C may be replaced with one of the multi-element insulating patterns 110a described with respect to FIGS. 7B, 8A, and 8B.

Figure 9A:
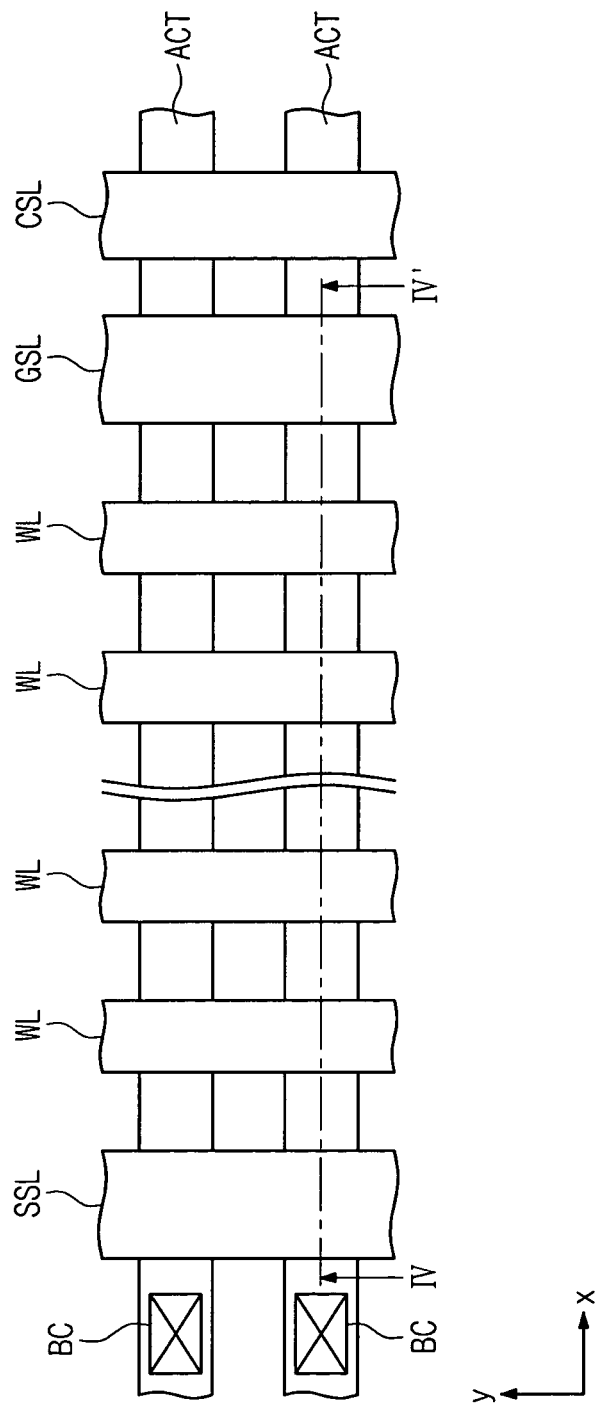
FIG. 9A illustrates a top plan view of a NAND type nonvolatile memory device in accordance with an embodiment.
Figure 9B:
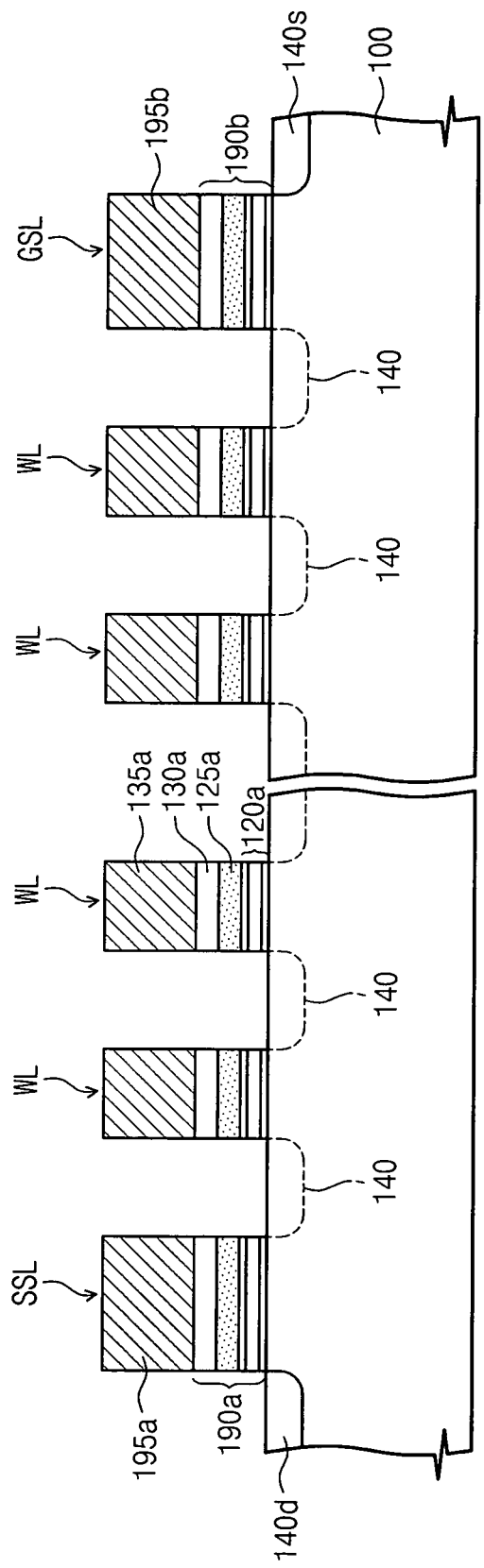
FIG. 9B illustrates a cross sectional view taken along the line IV-IV' of FIG. 9A.

Next, a NAND type nonvolatile memory device according to an embodiment will be described with respect to the drawings. FIG. 9A illustrates a top plan view of a NAND type nonvolatile memory device in accordance with an embodiment. FIG. 9B illustrates a cross sectional view taken along the line IV-IV' of FIG. 9A.

Referring to FIGS. 9A and 9B, a device isolation pattern defining a plurality of active regions (ACT) may be disposed in a substrate. The active regions (ACT) may extend in a first direction. The first direction may correspond to an x axis direction in FIG. 9A. A string selection line (SSL) and a ground selection line (GSL), which may be substantially parallel to each other, may cross the active regions (ACT). The string and ground selection lines (SSL, GSL) may extend in a second direction substantially perpendicular to the first direction. The second direction may correspond to a y axis direction in FIG. 9A. A plurality of word lines (WL) may cross the active regions (ACT) between the string selection line (SSL) and the ground selection line (GSL), side by side. The word lines (WL) and the selection lines (SSL, GSL) may be substantially parallel to one another.

Common drains 140d may be disposed in the active regions (ACT) of a side of the string selection line (SSL), respectively. Common sources 140s may be disposed in the active regions (ACT) of a side of the ground selection line (GSL), respectively. The common drains 140d and the common sources 140s may be regions doped with dopants. A cell source/drain 140 may be disposed in the active region (ACT) at sides of each word line (WL). The cell source/drain 140 may be a region doped with a dopant. In another embodiment, the cell source/drain 140 may be, e.g., an inversion layer generated by an edge electric field of the word line when an operation voltage is applied to the word line (WL).

A bit line contact plug (BC) may be connected to the common drain 140d. A plurality of bit line contact plugs (BC) may be spaced apart from one another along the second direction. A common source line (CSL) may be disposed on a side of the ground selection line (GSL). The common source line (CSL) may be electrically connected to the common source 140s. The common source line (CSL) may extend substantially parallel to the ground selection line (GSL) to be electrically connected to the plurality of sources 140s arranged in the second direction.

Each of the word lines (WL) may include the sequentially stacked charge storage pattern 125a, blocking insulating pattern 130a, and control gate electrode 135a. The tunnel insulating pattern 120a may be the tunnel insulating pattern 120a of any embodiment among the embodiments described above with respect to FIGS. 1 through 8. The charge storage pattern 125a, the blocking insulating pattern 130a, and the control gate electrode 135a have already been described, and repeated descriptions thereof are omitted.

The string selection line (SSL) may include a sequentially stacked first gate insulating layer 190a and a first gate electrode 195a. The ground selection line (GSL) may include a sequentially stacked second gate insulating layer 190b and a second gate electrode 195b. The first and second gate insulating layers 190a and 190b may include the same material as the tunnel insulating pattern 120a, the charge storage pattern 125a, and the blocking insulating pattern 130a. In this case, the tunnel insulating pattern 120a may extend to the side to be connected to the first and second gate insulating layers 190a and 190b. According to an embodiment, the first and second gate insulating layers 190a and 190b may include materials different from the tunnel insulating pattern 120a, the charge storage pattern 125a, and/or the blocking insulating pattern 130a.

Figure 10A:
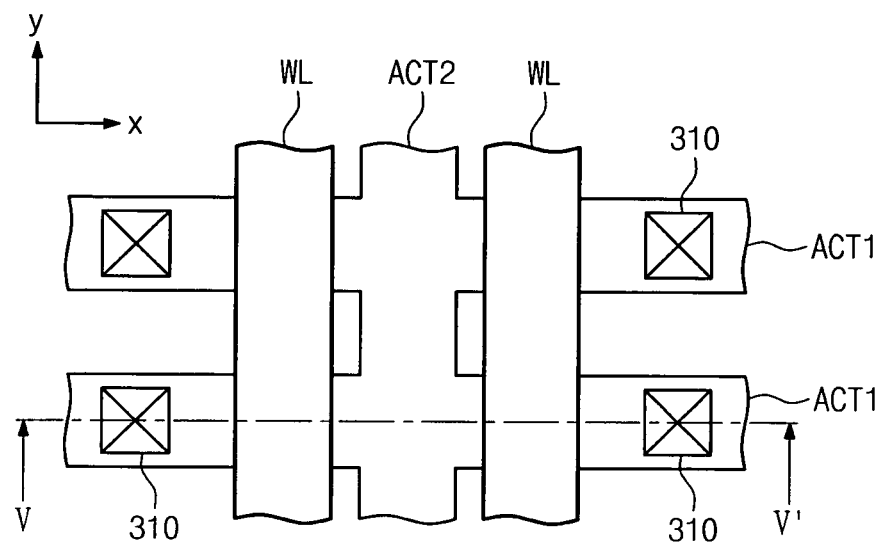
FIG. 10A illustrates a top plan view of a NOR type nonvolatile memory device in accordance with an embodiment.
Figure 10B:
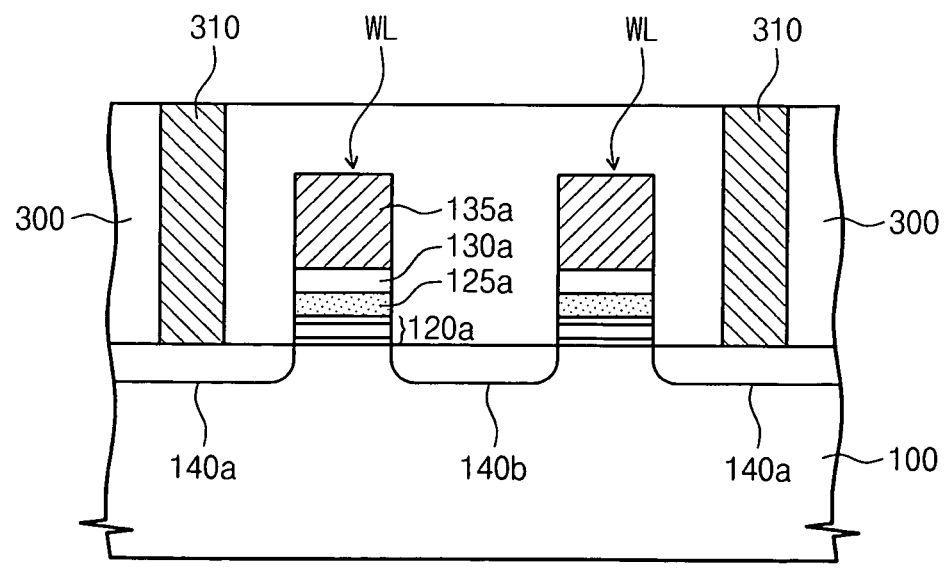
FIG. 10B illustrates a cross sectional view taken along the line V-V' of FIG. 10A.

Next, a NOR type nonvolatile memory device according to an embodiment will be described. FIG. 10A illustrate a top plan view of a NOR type nonvolatile memory device in accordance with another embodiment. FIG. 10B illustrates a cross sectional view taken along the line V-V' of FIG. 10A.

Referring to FIGS. 10A and 10B, a device isolation pattern may be disposed in a substrate 100 to define a first active region (ACT1) and a second active region (ACT2). A plurality of first active regions (ACT1) may extend in a first direction substantially parallel to one another. The second active region (ACT2) may extend in a second direction substantially perpendicular to the first direction. The second active region (ACT2) may cross the first active region (ACT1). The first direction may correspond to an x axis, and the second direction may correspond to a y axis of FIG. 10A. The first and second active regions (ACT1, ACT2) may be a portion of the substrate 100 surrounded by the device isolation pattern.

A pair of parallel word lines (WL) may cross the first active region (ACT1). The second active region (ACT2) may be disposed between the pair of word lines (WL). The pair of word lines (WL) may be separated from the second active region (ACT2). The pair of word lines (WL) may be respectively included in a pair of NOR type nonvolatile memory cells. A first source/drain 140a may be disposed in the first active region ACT1 of a side of each of the word lines (WL). A second source/drain 140b may be disposed in the second active region ACT2 of the other side of each of the word lines (WL). The second source/drain 140b may be disposed between the pair of word lines (WL). The pair of NOR type nonvolatile memory cells may share the second source/drain 140b. The second source/drain 140b may extend in the second direction along the second active region (ACT2). When the word line (WL) is spaced apart from the second active region (ACT2), the second source/drain 140b may extend in the first active region (ACT1) between the word line (WL) and the second active region (ACT2). The first source/drain 140a and the second source/drain 140b may be regions doped with dopants. The word line may include the sequentially stacked tunnel insulating pattern 120a, charge storage pattern 125a, and blocking insulating pattern 130a. The tunnel insulating pattern 120a may be the same as any one of the embodiments described above with reference to FIGS. 1 through 8.

An interlayer insulating layer 300 may be disposed on an entire surface of the memory device. Bit line contact plugs 310 may penetrate the interlayer insulating layer 300. The bit line contact plugs 310 may be connected to the first source/drains 140a, respectively. A bit line (not shown) may be electrically connected to the bit line contact plug 310. The bit line may extend substantially parallel to the first active region (ACT1), and may cover an upper portion of the first active region (ACT1). One bit line may be electrically connected to a plurality of the bit line contact plugs 310 connected to the one first active region (ACT1).

Figure 11:
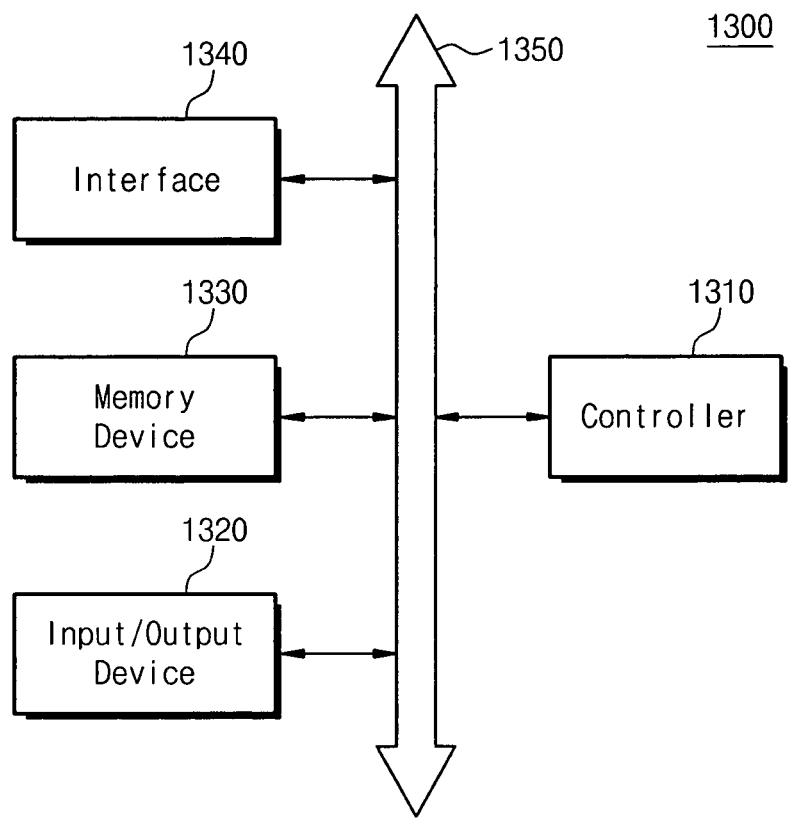
FIG. 11 illustrates a block diagram of an electronic system including a nonvolatile memory device in accordance with an embodiment.

According to an embodiment, the nonvolatile memory device described above may be included in an electronic system. The electronic system will be described in detail with respect to the drawings. FIG. 11 illustrates a block diagram representing an electronic system including a nonvolatile memory device in accordance with an embodiment.

Referring to FIG. 11, an electronic system 1300 may include a controller 1310, an input/output device 1320, and a memory device 1330. The controller 1310, the input/output device 1320, and the memory device 1330 may be connected to one another through a bus 1350. The bus 1350 may be a path through which data may transfer. The controller 1310 may include, e.g., at least one of a micro processor, a digital signal processor, a microcontroller, and/or a logic device having a function similar to the micro processor, the digital signal processor, and the microcontroller. The input/output device 1320 may include, e.g., a keypad, a keyboard, and/or a display device. The memory device 330 may be a device storing data. The memory device 1330 may store data and/or an instruction executed by the controller 1310. The memory device 1330 may include, e.g., a nonvolatile memory devices according to an embodiment. The electronic system 1300 may further include an interface 1340 for transmitting data to a communication network or receiving data from a communication network. The interface 1340 may be a wireline/wireless shape. The interface 1340 may include an antenna or a wireline/wireless transceiver.

The electronic system 1300 may be, e.g., a mobile system, a personal computer, an industrial computer, or a logic system performing a variety of functions. For example, the mobile system may include, e.g., a personal digital assistant (PDA), a portable computer, a web tablet, a mobile phone, a wireless phone, a laptop computer, a memory card, a digital music system, and/or a data transmission/receipt system. When the electronic system 300 is a wireless communication device, the electronic system 300 may be used in a communication interface protocol of a third generation, e.g., CDMA, GSM, NADC, E-TDMA, CDMA2000, etc.

Figure 12:
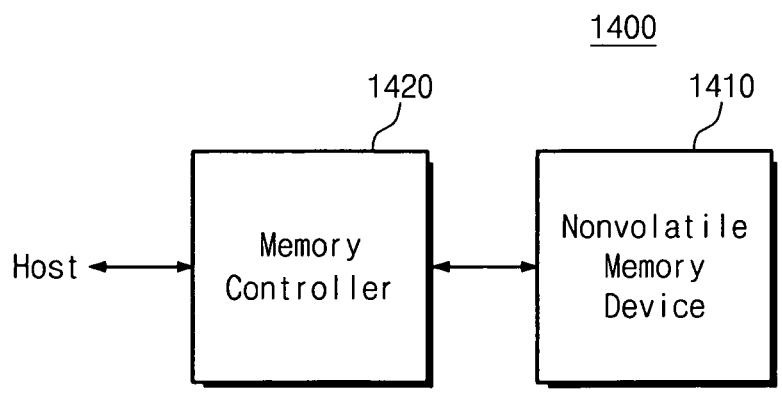
FIG. 12 illustrates a block diagram of a memory card including a nonvolatile memory device in accordance with an embodiment.

Next, a memory card according to an embodiment will be described in detail with reference to the drawings. FIG. 12 illustrates a block diagram representing a memory card including a nonvolatile memory device in accordance with an embodiment.

Referring to FIG. 12, a memory card 1400 may include a nonvolatile memory device 1410 and a memory controller 1420. The nonvolatile memory device 1410 may store data and may decode the stored data. The nonvolatile memory device 1410 may include, e.g., a nonvolatile memory device according to an embodiment. The memory controller 1420 may output stored data in response to a request of decoding/writing of a host or control the nonvolatile memory device 1410 to store data.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a nonvolatile memory device, comprising:
   forming a tunnel insulating layer on a substrate, wherein forming the tunnel insulating layer includes forming a multi-element insulating layer by a process including loading the substrate in a chamber and sequentially supplying a first element source, a second element source, and a third element source to the loaded substrate in the chamber, and the first element source, the second element source, and the third element source are different from one another;
   forming a charge storage layer on the tunnel insulating layer;
   forming a blocking insulating layer on the charge storage layer; and
   forming a control gate electrode on the blocking insulating layer.

2. The method as claimed in claim 1, wherein one of the first, second, and third element sources is a silicon source, another is a nitrogen source, and the other is an oxygen source.

3. The method as claimed in claim 2, wherein the third element source is the oxygen source and one of the first and second element sources is the silicon source and the other is the nitrogen source.

4. The method as claimed in claim 2, wherein:
   the multi-element insulating layer includes a silicon oxynitride layer, and
   an oxygen content of the multi-element insulating layer is about 30 at. % to about 60 at. %.

5. The method as claimed in claim 1, wherein forming the multi-element insulating layer includes performing a plurality of cycles, each cycle including sequentially supplying the first element source, the second element source, and the third element source to the substrate.

6. The method as claimed in claim 1, wherein forming the multi-element insulating layer includes, in sequence:
   adsorbing the first element source onto the substrate;
   purging a non-adsorbed first element source;

supplying the second element source to the substrate to react with the adsorbed first element source;

purging an unreacted second element source and a reaction residual;

supplying the third element source to the substrate to react with the reacted first and second elements; and purging an unreacted third element source and a reaction residual.

7. A method of forming a nonvolatile memory device, comprising:

forming a tunnel insulating layer on a substrate, wherein forming the tunnel insulating layer includes:

forming a multi-element insulating layer by a process including sequentially supplying a first element source, a second element source, and a third element source to the substrate, one of the first, second, and third element sources is a silicon source, another is a nitrogen source, and the other is an oxygen source; forming the multi-element insulating layer includes performing a plurality of cycles, each cycle including sequentially supplying the first element source, the second element source, and the third element source to the substrate; an amount of the oxygen source supplied during the first cycle among the cycles is different from an amount of the oxygen source supplied during a last cycle among the cycles; and an energy band gap of a bottom surface of the multi-element insulating layer being different from an energy band gap of a top surface of the multi-element insulating layer;

forming a charge storage layer on the tunnel insulating layer;

forming a blocking insulating layer on the charge storage layer; and forming a control gate electrode on the blocking insulating layer.

8. The method as claimed in claim 7, wherein the amount of the oxygen source supplied during the first cycle is greater than the amount of the oxygen source supplied during the last cycle.

9. The method as claimed in claim 8, wherein:

the plurality of cycles include at least one middle cycle between the first cycle and the last cycle, and an amount of the oxygen source supplied during the middle cycle is equal to or less than an amount of the oxygen source supplied during a cycle performed just before the middle cycle.

10. The method as claimed in claim 7, wherein the amount of the oxygen source supplied during the first cycle is less than the amount of the oxygen source supplied during the last cycle.

11. The method as claimed in claim 10, wherein:

the plurality of cycles include at least one middle cycle between the first cycle and the last cycle, and an amount of the oxygen source supplied during the middle cycle is equal to or greater than an amount of the oxygen source supplied during a cycle performed just before the middle cycle.

12. The method as claimed in claim 1, wherein:

forming the tunnel insulating layer further includes forming a nitrogen treated interface layer on the substrate prior to forming the multi-element insulating layer, the multi-element insulating layer being formed on the nitrogen treated interface layer; and forming the nitrogen treated interface layer includes performing a thermal oxidation process on the substrate to form an interface layer and performing a nitrogen treatment process on the interface layer to form the nitrogen treated interface layer.

13. The method as claimed in claim 1, wherein forming the tunnel insulating layer further includes forming an interface layer on the substrate prior to forming the multi-element insulating layer, and the multi-element insulating layer is formed on the interface layer.

14. The method as claimed in claim 1, further comprising annealing the multi-element insulating layer prior to forming the charge storage layer.

15. The method as claimed in claim 14, wherein a process gas used in the annealing includes at least one of oxygen, ozone, nitrogen, nitric oxide, nitrous oxide, chlorine, and fluorine.

16. The method as claimed in claim 1, wherein forming the multi-element insulating layer includes sequentially supplying the first element source to the substrate at a first temperature, the second element source to the substrate at a second temperature, and the third element source to the substrate at a third temperature.

17. The method as claimed in claim 16, wherein the first temperature, the second temperature, and the third temperature are all different from each other.

18. The method as claimed in claim 11, wherein an energy band gap of the multi-element insulating layer is substantially uniform.

19. The method as claimed in claim 5, wherein:

one of the first, second, and third element sources is a silicon source, another is a nitrogen source, and the other is an oxygen source, and an amount of the nitrogen source supplied during the first cycle among the plurality of cycles is substantially equal to an amount of the nitrogen source supplied during the last cycle among the plurality of cycles.

20. The method as claimed in claim 5, wherein:

one of the first, second, and third element sources is a silicon source, another is a nitrogen source, and the other is an oxygen source, and an amount of silicon source supplied during the first cycle among plurality of cycles is substantially equal to an amount of the silicon source supplied during the last cycle among plurality of cycles.

21. The method as claimed in claim 5, wherein:

one of the first, second, and third element sources is a silicon source, another is a nitrogen source, and the other is an oxygen source, and forming the multi-element insulating layer includes changing an amount of the oxygen source supplied during each cycle of the plurality of cycles by a predetermined amount such that the energy band gap of the multi-element insulating layer substantially linearly decreases from the bottom surface of the multi-element insulating layer to the top surface of the multi-element insulating layer.

* * * * *